(12) United States Patent
Scheiper et al.

(10) Patent No.: US 8,722,498 B2
(45) Date of Patent: May 13, 2014

(54) SELF-ALIGNED FIN TRANSISTOR FORMED ON A BULK SUBSTRATE BY LATE FIN ETCH

(75) Inventors: Thilo Scheiper, Dresden (DE); Andy Wei, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 1 day.

(21) Appl. No.: 13/209,057

(22) Filed: Aug. 12, 2011

(65) Prior Publication Data

US 2012/0161238 A1   Jun. 28, 2012

(30) Foreign Application Priority Data

Dec. 28, 2010   (DE) .......................... 10 2010 064 283

(51) Int. Cl.
*H01L 27/105*   (2006.01)
(52) U.S. Cl.
USPC ........... 438/289; 438/157; 438/283; 438/299; 257/368; 257/E21.409; 257/E27.081
(58) Field of Classification Search
None
See application file for complete search history.

(56) References Cited

U.S. PATENT DOCUMENTS

| | | | | |
|---|---|---|---|---|
| 6,118,161 | A * | 9/2000 | Chapman et al. | 257/401 |
| 7,456,476 | B2 * | 11/2008 | Hareland et al. | 257/349 |
| 2005/0020020 | A1 * | 1/2005 | Collaert et al. | 438/300 |
| 2007/0145487 | A1 * | 6/2007 | Kavalieros et al. | 257/368 |
| 2007/0278595 | A1 * | 12/2007 | Wu | 257/384 |
| 2008/0242075 | A1 * | 10/2008 | Oh et al. | 438/594 |
| 2009/0302372 | A1 * | 12/2009 | Chang et al. | 257/327 |
| 2009/0321836 | A1 * | 12/2009 | Wei et al. | 257/365 |
| 2010/0133615 | A1 * | 6/2010 | Mulfinger et al. | 257/347 |
| 2012/0038006 | A1 * | 2/2012 | Zhu et al. | 257/402 |
| 2012/0126325 | A1 * | 5/2012 | Wang et al. | 257/365 |
| 2012/0142182 | A1 * | 6/2012 | Furukawa et al. | 438/595 |

OTHER PUBLICATIONS

Translation of Official Communication from German Patent Application No. 10 2010 064 283.5 dated Sep. 6, 2011.

* cited by examiner

*Primary Examiner* — Minh-Loan T Tran
*Assistant Examiner* — Fazli Erdem
(74) *Attorney, Agent, or Firm* — Amerson Law Firm, PLLC

(57) ABSTRACT

Non-planar transistors, such as FinFETs, may be formed in a bulk configuration in the context of a replacement gate approach, wherein the semiconductor fins are formed during the replacement gate sequence. To this end, in some illustrative embodiments, a buried etch mask may be formed in an early manufacturing stage on the basis of superior process conditions.

20 Claims, 18 Drawing Sheets

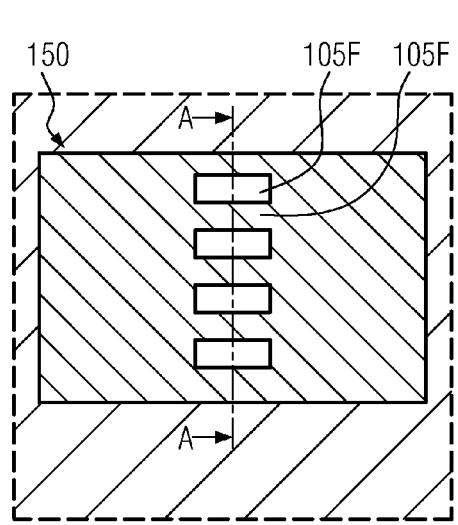
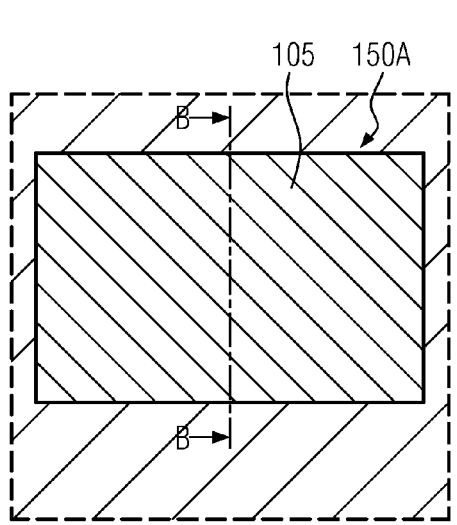
FIG. 24a    FIG. 24b
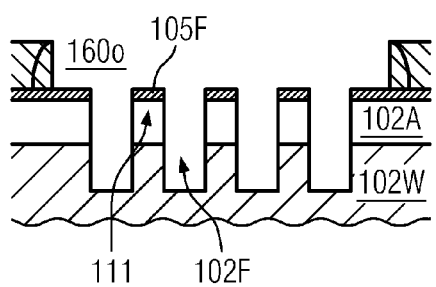
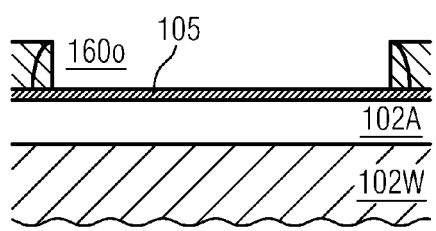
FIG. 25a    FIG. 25b

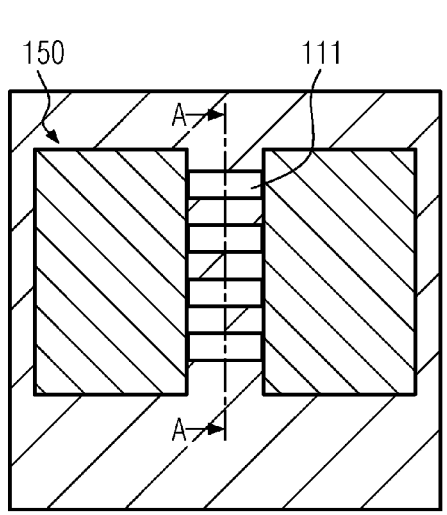
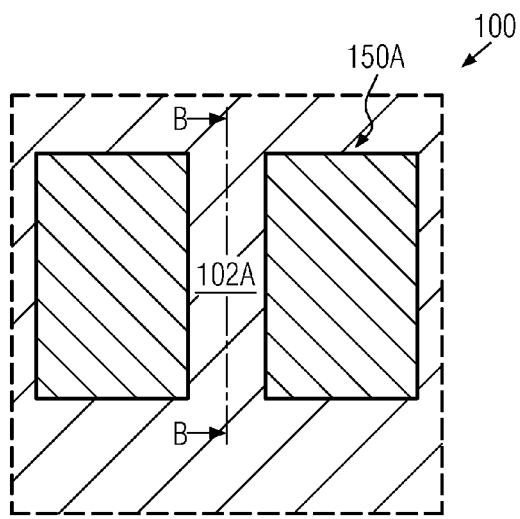
FIG. 26a　　　　　FIG. 26b
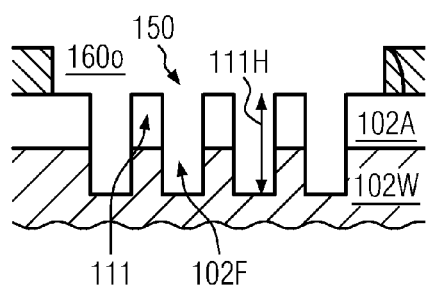
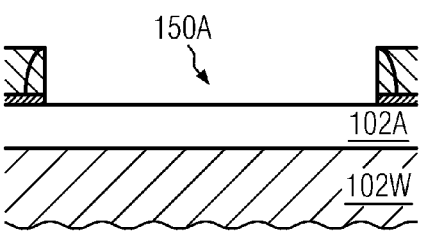
FIG. 27a　　　　　FIG. 27b

SELF-ALIGNED FIN TRANSISTOR FORMED ON A BULK SUBSTRATE BY LATE FIN ETCH

BACKGROUND OF THE INVENTION

1. Field of the Invention

Generally, the present disclosure relates to highly sophisticated integrated circuits including transistor elements having triple gate architecture (FinFET).

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a planar transistor architecture, on the distance between the source and drain regions, which is also referred to as channel length.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the dominant importance of silicon in fabricating semiconductor devices has been the superior characteristics of a silicon/silicon dioxide interface that allows reliable electrical insulation of different regions from each other. The silicon/silicon dioxide interface is stable at high temperatures and thus allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is prefer-ably used as a gate insulation layer that separates the gate electrode, frequently comprised of polysilicon or other metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. The relatively high leakage current caused by direct tunneling of charge carriers through an ultra-thin silicon dioxide gate insulation layer may reach values for an oxide thickness in the range of 1-2 nm that may not be compatible with requirements for performance driven circuits.

For this reason, superior gate electrode structures have been developed in which new gate dielectric materials may be implemented, possibly in combination with additional electrode materials, in order to provide superior capacitive coupling between the gate electrode and the channel region, while at the same time maintaining the resulting leakage currents at a low level. To this end, so-called high-k dielectric materials may frequently be used, which are to be understood as dielectric materials having a dielectric constant of 10.0 and higher. For example, a plurality of metal oxides or silicates may be used, possibly in combination with conventional very thin dielectric materials, in order to obtain sophisticated high-k metal gate electrode structures. For example, in some well-established approaches, the gate electrode structures of planar transistors may be formed on the basis of well-established concepts, i.e., using conventional gate dielectrics and polysilicon material, wherein the sophisticated material systems may then be incorporated in a very late manufacturing stage, i.e., prior to forming any metallization systems and after completing the basic transistor configuration by replacing the polysilicon material with the high-k dielectric material and appropriate gate electrode materials. Consequently, in any such replacement gate approaches, well-established process techniques and materials may be used for forming the basic transistor configurations, while in a late manufacturing stage, i.e., after performing any high temperature processes, the sophisticated gate materials may be incorporated.

In view of further device scaling and possibly based on well-established materials, new transistor configurations have been proposed in which a "three dimensional" architecture is provided in an attempt to obtain a desired channel width, while at the same time superior controllability of the current flow through the channel region is preserved. To this end, so-called FinFETs have been proposed in which a thin sliver of thin silicon is formed in a thin active layer of a silicon-on-insulator (SOI) substrate, wherein on both sidewalls and, if desired, on a top surface, a gate dielectric material and a gate electrode material are provided thereby realizing a multiple gate transistor whose channel region may be fully depleted. Typically, in sophisticated applications, the width of the silicon fins is on the order of magnitude of 10-20 nm and the height thereof is on the order of magnitude of 30-40 nm. In some conventional approaches for forming Fin- FETs, the fins are formed as elongated device features followed by the deposition of the gate electrode materials, possibly in combination with any spacers, and thereafter the end portions of the fins may be "merged" by epitaxially growing a silicon material, which may result in complex manufacturing processes, thereby also possibly increasing the overall external resistance of the resulting drain and source regions.

In further attempts to provide FinFETs on the basis of a bulk configuration, it has been proposed to form semiconductor fins in a bulk substrate on the basis of a self-aligned process strategy in which a gate opening is defined by an appropriate etch mask formed above the semiconductor material. In a further step, the opening is patterned by complex lithography techniques so as to obtain a further mask, which may define the lateral position and size of the fins, which may subsequently be formed on the basis of complex patterning strategies. Thereafter, an appropriate dielectric material such as silicon dioxide may be filled into the resulting structure in order to appropriately adjust the electrical effective height of the previously etched fins. Although this approach may represent a promising manufacturing technique, a complex process strategy may have to be applied prior to actually patterning the gate electrode in order to form the fins in the gate opening and adjusting their effective electrical height.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which FinFET devices may be formed on a bulk substrate in a self-aligned manner, that is self-aligned with respect to a gate electrode structure, by defining the size and position of the semiconductor fins on the basis of a buried etch mask which may be used in a late manufacturing stage, i.e., upon performing a replacement gate approach, wherein the semiconductor fins may be formed without requiring any extra process steps. Furthermore, the electrically effective height or depth of the semiconductor fins may be adjusted on the basis of the characteristics of the source and drain regions, thereby avoiding the incorporation of dedicated isolation regions upon forming the semiconductor fins. In this manner, a very efficient overall process flow may be established in the context of a replacement gate approach, wherein FinFETs and planar transistors may be formed during the same process strategy by appropriately providing the buried etch mask, which may be provided in a non-structured manner for planar transistors, while the corresponding patterning of the buried etch mask may define the size and position of the semiconductor fins for the non-planar transistors.

One illustrative method disclosed herein comprises forming a hard mask layer above a semiconductor region of a semiconductor device, wherein the hard mask layer comprises a plurality of mask features that define a lateral size and position of a plurality of fins to be formed in the semiconductor region. The method further comprises forming a placeholder gate electrode structure above the hard mask layer and forming drain and source regions in the semiconductor region in the presence of the placeholder gate electrode structure. Furthermore, the method comprises forming the fins in the semiconductor region by removing a placeholder material of the placeholder gate electrode structure and forming cavities in the semiconductor region by using the hard mask layer as an etch mask. Furthermore, the method comprises forming a gate dielectric material and an electrode material in the cavities and above the fins.

A further illustrative method disclosed herein relates to forming a semiconductor device. The method comprises forming a gate opening in a placeholder gate electrode structure that is formed above a semiconductor region. Furthermore, a plurality of fins are formed in the semiconductor region through the gate opening by forming cavities in the semiconductor region. Moreover, the method comprises forming a gate dielectric material and an electrode material in the cavities and in the gate opening.

One illustrative semiconductor device disclosed herein comprises a substrate comprising a crystalline semiconductor material. Furthermore, the semiconductor device comprises a drain region and a source region that are formed in a semiconductor region, which in turn directly connects to the crystalline semiconductor material. Furthermore, a plurality of semiconductor fins are formed in the semiconductor region and extend between the drain region and the source region, wherein the plurality of semiconductor fins have a geometric height that is greater than an electrically effective height. Additionally, the semi-conductor device comprises a gate electrode structure formed above and laterally adjacent to the semiconductor fins, wherein the gate electrode structure extends along the geometric height of the plurality of semiconductor fins.

BRIEF DESCRIPTION OF THE DRAWINGS

The disclosure may be understood by reference to the following description taken in conjunction with the accompanying drawings, in which like reference numerals identify like elements, and in which:

FIGS. 2-29 schematically illustrate cross-sectional views of a semiconductor device during various manufacturing stages in forming FinFETs, possibly in combination with planar transistors during various manufacturing stages, according to illustrative embodiments.

Figure 1A:
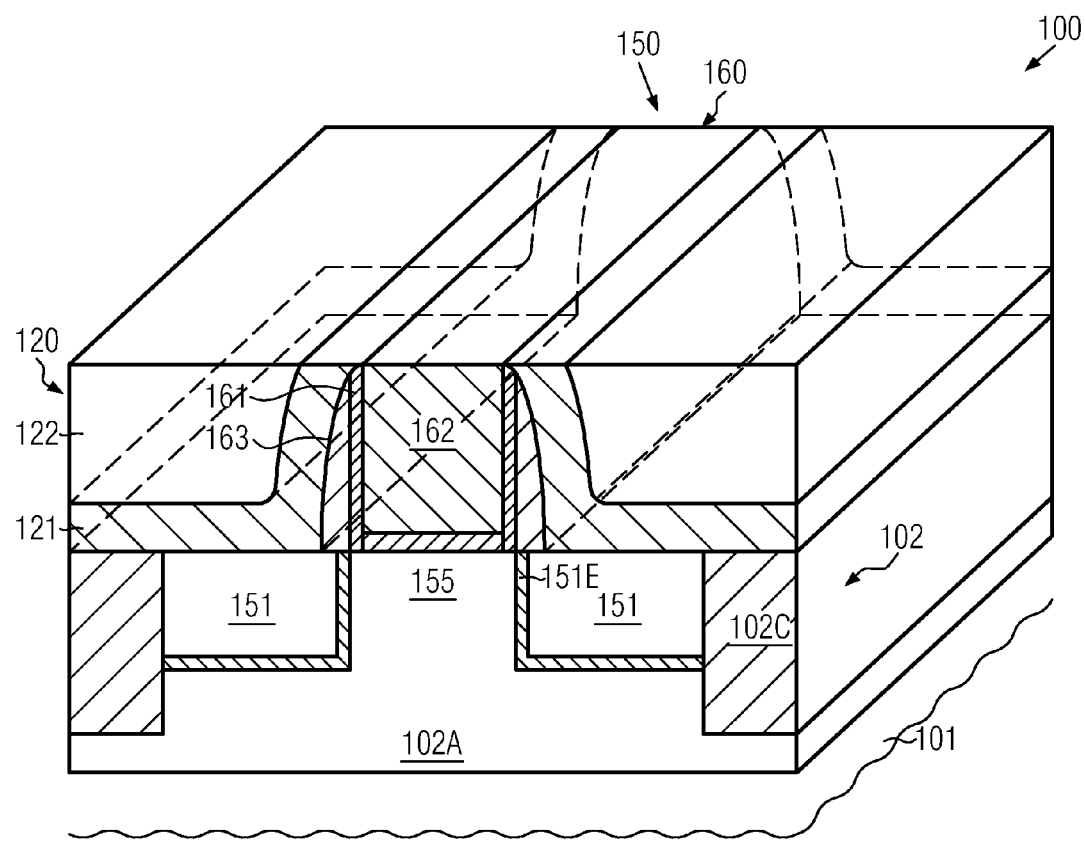
FIG. 1a schematically illustrates a perspective view of a three-dimensional transistor or FinFET, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure contemplates manufacturing techniques and semiconductor devices in which a non-planar transistor configuration or a FinFET may be provided on a bulk substrate in a self-aligned manner by forming the semiconductor fins in a late manufacturing stage, i.e., upon replacing placeholder materials of the gate electrode structure with appropriate gate materials, such as a gate dielectric material and an electrode material, wherein, in some illustrative embodiments, the etch process for forming the semiconductor fins may be accomplished on the basis of a buried etch mask. That is, the etch mask may be provided in an early manufacturing stage, i.e., prior to depositing and patterning the placeholder gate electrode structure, thereby enabling a process flow in which conventional process techniques may be applied for patterning gate electrode structures and for forming sophisticated drain and source regions prior to actually creating a pronounced surface topography upon forming the semiconductor fins. In some illustrative embodiments, the electrically effective depth or height of the semiconductor fins is adjusted by the electrically effective depth of the drain and source areas without requiring any underlying dielectric material, as is the case in conventional process strategy. To this end, in some illustrative embodiments, the drain and source areas may be provided with a precise dopant profile which may be accomplished by incorporating the dopant species on the basis of epitaxial growth techniques in which an in situ doped semiconductor material, such as silicon, silicon/germanium, silicon/carbon, silicon/phosphorous and the like, may be incorporated in a highly controllable manner. That is, the incorporation of the drain and source dopant species may be controlled by the size and shape of the corresponding cavities formed in the drain and source areas, while an appropriate "fine tuning" of the drain and source dopant profiles may be accomplished by using appropriate deposition techniques and deposition parameters and/or by applying well-controllable anneal processes, such as laser-based anneal techniques and the like, in order to initiate a well-controllable diffusion of the previously in situ incorporated drain and source dopants.

Consequently, well-established process techniques may be applied so as to obtain the FinFET transistors, possibly together with planar transistors, without unduly adding additional process complexity compared to conventional replacement gate approaches.

FIG. 1a schematically illustrates a perspective view of a semiconductor device 100 comprising a three-dimensional transistor 150, which is also referred to as a FinFET device. As shown, the semiconductor device 100 may comprise a substrate 101, which may be any appropriate carrier material, which, however, may typically be comprised of a crystalline semiconductor material, such as a silicon material and the like. Moreover, a semiconductor layer 102, which may directly connect the crystalline material of the substrate 101, thereby providing a bulk architecture, may be provided with any appropriate characteristics, for instance in the form of a silicon material, a silicon/germanium material and the like. It should be appreciated that the semiconductor layer 102 may comprise, in the manufacturing stage shown, a plurality of active regions 102A, which are to be understood as portions of the semiconductor layer 102, which may be laterally delineated by an isolation region 102C and which may have an appropriate basic dopant profile so as to electrically isolate the transistor 150 in the "vertical" direction with respect to the substrate material 101 by means of an appropriate well doping, while in an upper portion of the active region 102A, appropriate dopant profiles may be established so as to obtain drain and source regions. For example, the transistor 150 may comprise drain and source regions 151, which may represent highly doped semiconductor regions, in combination with doped regions 151E of reduced dopant concentration, which may also be referred to as drain and source extension regions, may be provided so as to appropriately adjust the resulting electrical field distribution and other characteristics as required for the transistor 150. It should be appreciated that additionally areas of locally increased well dopant concentration, also referred to as halo regions (not shown in FIG. 1a), may be provided so as to appropriately adjust the overall transistor characteristics. Consequently, the drain and source regions 151 may be electrically isolated with respect to the depth of the respective region 102A by a corresponding counter-doped area with appropriate dopant concentration. Furthermore, in the manufacturing stage shown, a gate electrode structure 160 is formed above the active region 102A and may comprise an appropriate gate dielectric material 161, such as a conventional dielectric material, a high-k dielectric material or any combination thereof, in combination with an appropriate electrode material 162, such as a metal-containing electrode material, possibly in combination with appropriate work function metals and the like. Furthermore, the gate electrode structure 160 may comprise a spacer structure 163 of any appropriate configuration. Additionally, an interlayer dielectric material system 120, for instance in the form of two or more material layers, such as a silicon nitride layer 121 and a silicon dioxide layer 122, may be provided so as to laterally enclose the gate electrode structure 160. It should be appreciated that corresponding semiconductor fins formed in the active region 102A may not be visible in the illustration of FIG. 1a and may be formed so as to be covered by the gate electrode structure 160 and may extend into the depth of the active region 102A so as to be deeper than the drain and source regions 151 including the extension regions 151E. In this manner, it may be ensured that the electrically effective depth or height of the corresponding semiconductor fins be defined by the electrically effective depth of the drain and source regions 151 since, as discussed before, the area below the drain and source regions 151 is electrically isolated from the remaining portion of the semiconductor material by the appropriate well dopant in the active region 102A.

It should be appreciated that generally the cross-sectional shape of the drain and source regions 151 may have any appropriate configuration so as to establish the desired transistor characteristics. As for instance shown later on, other configurations in which the drain and source regions 151 extend significantly below the gate electrode material 162 may be provided by appropriately controlling the incorporation of the dopant species, for instance by providing appropriately shaped cavities, as will also be explained later on in more detail.

Figure 1B:
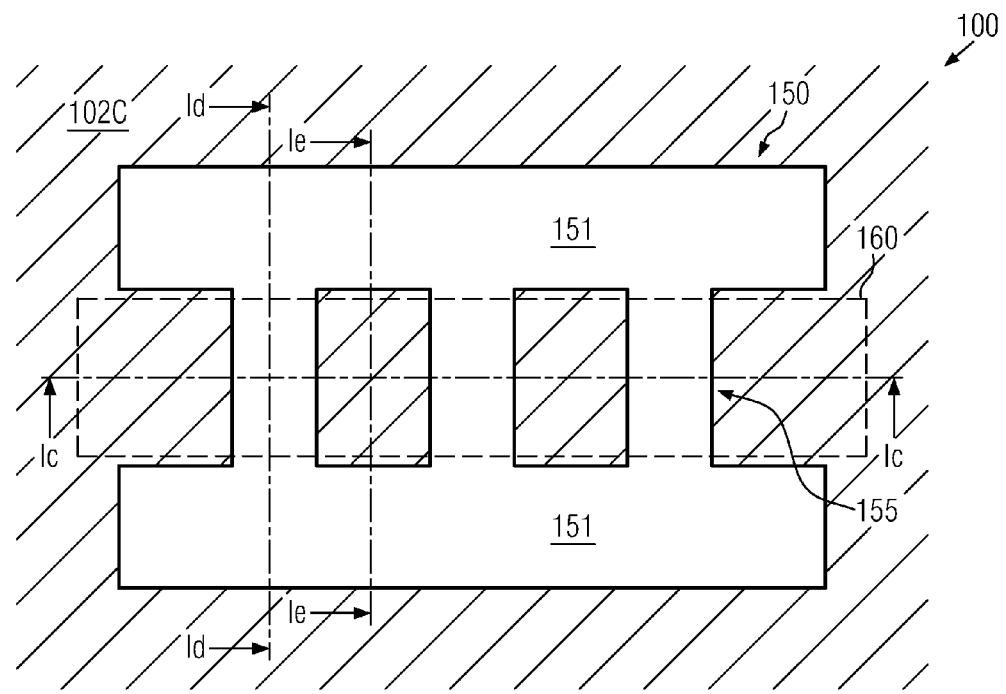
FIG. 1b schematically illustrates a top view of the FinFET of FIG. 1a with a plurality of self-aligned semiconductor fins, according to illustrative embodiments.

FIG. 1b schematically illustrates a top view of the transistor 150 wherein the gate electrode structure is not shown in order to demonstrate the configuration of the drain and source regions 151 and of semiconductor fins 155, which are formed between the drain and source regions 151 and represent corresponding channel regions connecting the drain and source regions 151. Thus, the vertical direction in FIG. 1b may be considered as the basic current flow direction of the transistor 150 and may thus also be referred to as a length direction. On the other hand, the horizontal direction of FIG. 1b may be considered as a width direction of the transistor 150, wherein the actual width that is available for the current flow may be determined by the electrically effective depth or height of the semiconductor fins 155 and their extension in the width direction, i.e., the width of the semiconductor fins 155. As illustrated, the transistor 150 may have a similar configuration as a planar transistor except for a plurality of semiconductor fins connecting the drain and source regions 151 instead of providing a continuous channel region which, however, may be controlled by a gate electrode formed above the channel region, thereby resulting in severe short channel effects as discussed above. On the other hand, the channel control may be accomplished in the semiconductor fins 155 via any sidewalls and a top surface thereof, thereby providing the superior controllability of the transistor 150.

Figure 1C:
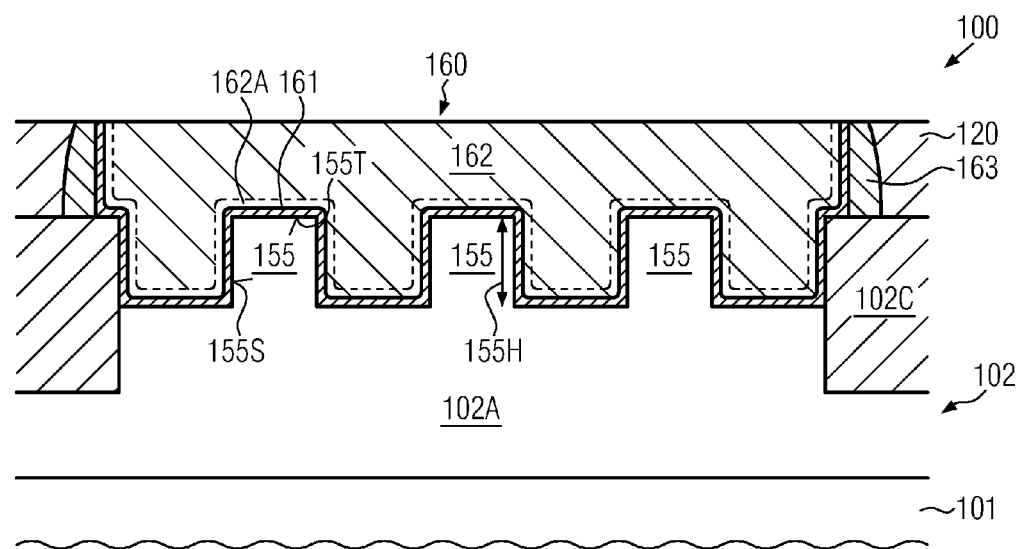
FIG. 1c schematically illustrates a cross-sectional view along a transistor width direction according to the section Ic of FIG. 1b, according to illustrative embodiments.

FIG. 1c schematically illustrates a cross-sectional view of the device 100 along the section as indicated as Ic in FIG. 1b. That is, the cross-sectional view of FIG. 1c may correspond to a section along the transistor width direction, as discussed above. As illustrated, the isolation region 102C may laterally delineate the active region 102A, which comprise a comb-like structure of the semiconductor fins 155, which may have a geometric height or depth 155H that may be adjusted on the basis of an etch process to be performed in a late manufacturing stage, as will be discussed later on in more detail. Furthermore, as explained before, the geometric height or depth 155H of the semiconductor fins 155 may be greater than the depth of the drain and source regions 151 (FIG. 1a). Furthermore, as illustrated, the gate electrode structure 160 may comprise the electrode material 162, possibly in combination with an appropriate work function metal species 162A in order to adjust the overall electronic characteristics of the gate electrode structure 160. Moreover, the gate dielectric material 161 may be formed on a top surface 155T and sidewall surface areas 155S of the semiconductor fins 155. In some illustrative embodiments, the gate dielectric material 161 may comprise a high-k dielectric material, such as hafnium oxide, zirconium oxide and the like. Furthermore, as shown, the spacer structure 163 may be provided and the entire gate electrode structure 160 may be laterally embedded in the interlayer dielectric material 120.

Figure 1D:
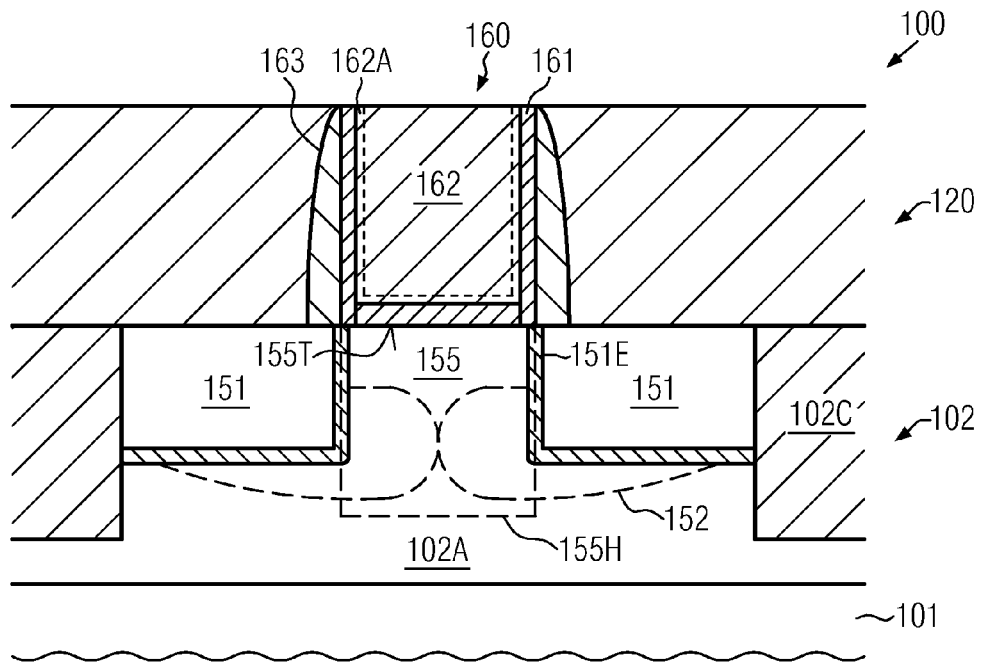
FIGS. 1d and 1e schematically illustrate cross-sectional views of the FinFET at a lateral position corresponding to a FinFET and to a space or cavity formed between two adjacent FinFETs, according to illustrative embodiments.

FIG. 1d schematically illustrates a cross-sectional view along the line Id of FIG. 1b, i.e., this section may illustrate a section along the transistor length direction at a lateral position that corresponds with a section through the semiconductor fin 155. As shown, the drain and source regions 151 are formed in the active region 102A, as is also discussed above with reference to FIG. 1a, and may thus connect to the semiconductor fin 155 in order to enable the formation of a conductive channel therein. Moreover, the gate electrode structure 160 may be formed "on" the semiconductor fin 155 in this section and may thus control the channel in the semiconductor fin 155 via the top surface 155T. Furthermore, as previously discussed, in the active region, appropriate halo regions 152 may be provided so as to adjust the overall electronic characteristics of the semiconductor fin 155 and also to reliably isolate the fin 155 with respect to the depth of the active region 102A. Moreover, as illustrated in dashed lines, the depth of the fin 155H may extend below the drain and source regions 151, as is also previously explained.

Figure 1E:
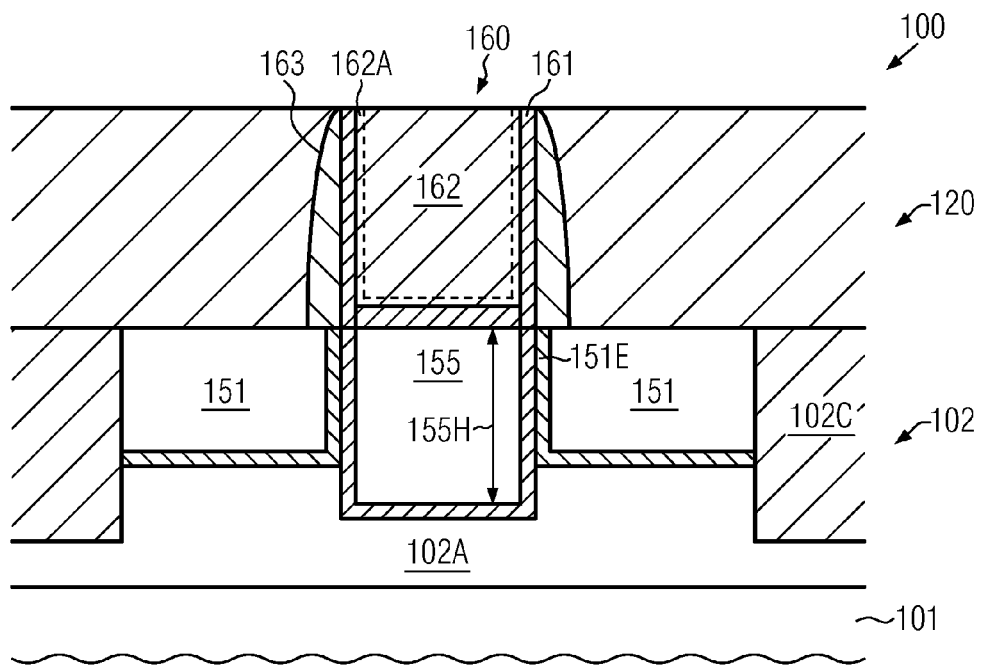

FIG. 1e schematically illustrates the device 100 according to a cross-sectional view as indicated by the section line Ie in FIG. 1b, i.e., the section corresponds to a section along the transistor length direction in an area between two adjacent semiconductor fins. Consequently, as shown, the gate electrode structure 160 extends along the entire height or depth 155H of the semiconductor fins and thus extends below the drain and source regions 151.

Consequently, in the configuration of the transistor 150 as shown in FIGS. 1a-1e, the drain and source regions 151 including the extension regions 151E may have a substantially "box-like" configuration, thereby forming a relatively large interface with any sidewalls of the semiconductor fins 155, which may provide an increased electrically effective height or depth of the semiconductor fins, since a large portion of the geometric height 155H is electrically active when forming a channel between the drain and source regions 151. Thus, the overall current drive capability and the resistivity of the resulting channel may be moderately high, while the resulting capacitance between the drain and source regions and the channel region may be increased.

Figure 1F:
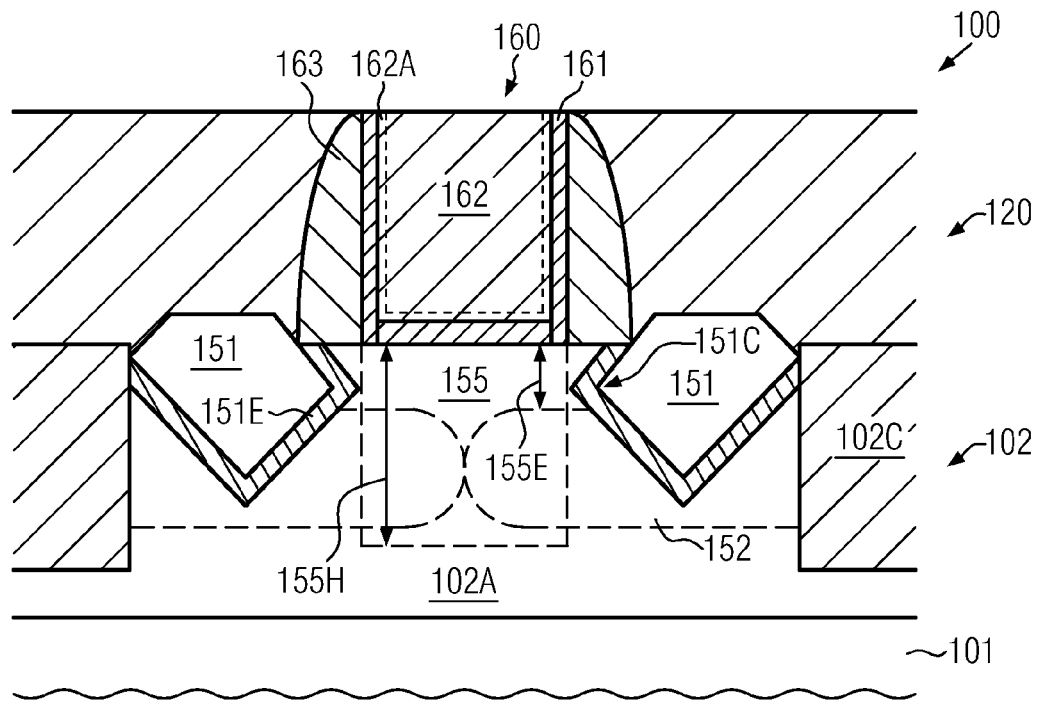
FIG. 1f schematically illustrates a cross-sectional view of a FinFET according to illustrative embodiments in which drain and source regions may be provided on the basis of crystallographically anisotropically etched drain and source cavities.

FIG. 1f schematically illustrates a cross-sectional view, for instance corresponding to the cross-sectional as illustrated in FIG. 1b by the section line Id, wherein an electrically effective depth or height 155E of the semiconductor fins 155 may be reduced for the same geometric height 155H by appropriately shaping the drain and source regions 151, as discussed above. In the embodiment shown, the drain and source regions 151 may have a "sigma-shaped" configuration in which inclined sidewall portions may define a corresponding etch 151C, which may substantially define an area in which a channel may form in the fin 155 upon applying an appropriate control voltage to the gate electrode structure 160. It should be appreciated that the corresponding position of the etch 151C may be adjusted on the basis of the process parameters for incorporating the dopant species 151, for instance in the form of providing a sigma-shaped cavity and using an epitaxial growth technique, while also the width of the spacer structure 163 may be appropriately selected so as to obtain the desired overall configuration.

Consequently, as discussed above, the FinFET may be formed so as to have any appropriate transistor characteristics, while also the same process techniques may be applied for planar transistors, if required, by avoiding the formation of the semiconductor fins in a very advanced manufacturing stage, i.e., by performing a replacement gate approach, thereby achieving a high design flexibility in providing transistors of different performance characteristics without requiring additional process steps.

With reference to FIGS. 2-29, manufacturing strategies will now be described in forming the semiconductor device 100 as shown in FIGS. 1*a*-1*e*. It should be appreciated that the same reference numerals will be used throughout FIGS. 2-29 and any detailed description of any components described so far may be omitted, if considered appropriate.

Figure 2:
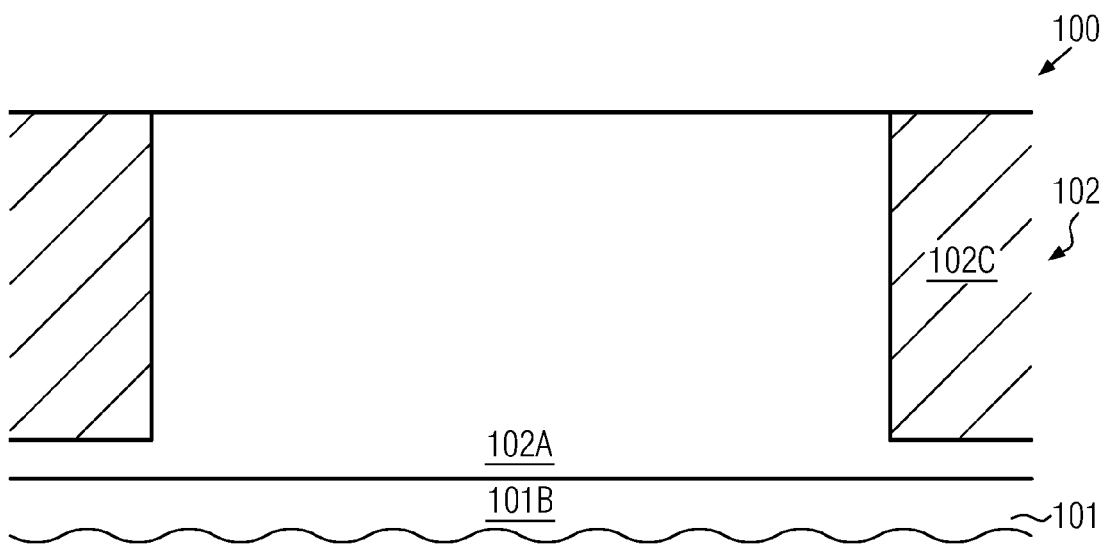

FIG. 2 schematically illustrates a cross-sectional view of the device 100 in an early manufacturing stage wherein the sectional view may be taken along the transistor width direction, i.e., along the line I*d* as shown in FIG. 1*d*. In this manufacturing stage, the isolation region 102C may be formed in the semiconductor layer 102, thereby laterally delineating the active region 102A, which in turn may directly connect to the crystalline substrate material 101B, as described above. The isolation region 102C may be provided on the basis of any appropriate process strategy, for instance by forming isolation trenches and filling the isolation trenches with an appropriate dielectric material, such as silicon dioxide, silicon nitride and the like.

Figure 3:
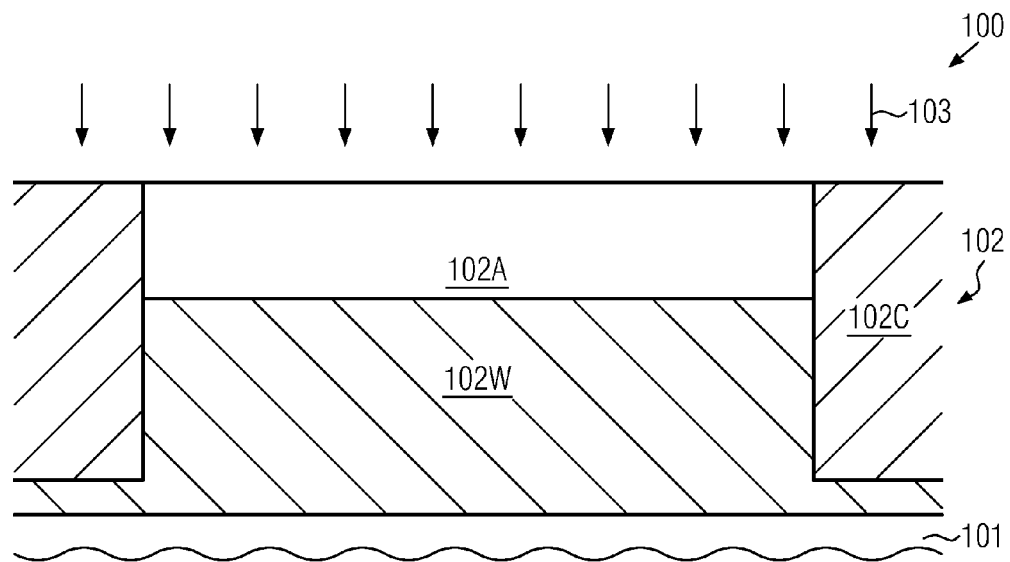

FIG. 3 schematically illustrates the device 100 during an implantation process 103 in order to incorporate an appropriate well dopant species in order to form a well region 102W so as to electrically isolate a portion of the active region 102A from the underlying semiconductor material, as is also discussed above. A corresponding well dopant concentration, which may later on be modified by incorporating additional well dopant species in a localized manner, may be indicated as 102W. To this end, well-established masking regimes and implantation techniques may be applied.

Figure 4:
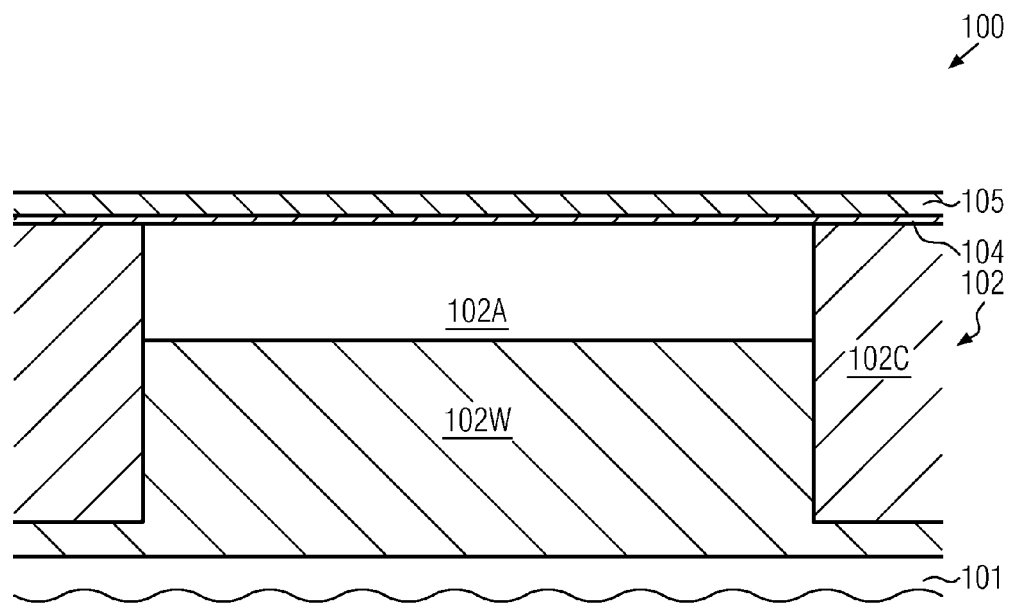

FIG. 4 schematically illustrates the device 100 after forming a mask layer stack, for instance comprising an etch stop liner 104, for instance in the form of a silicon oxide material, followed by the actual hard mask material 105, such as a silicon nitride material. To this end, well-established deposition techniques and the like may be applied.

Figure 5:
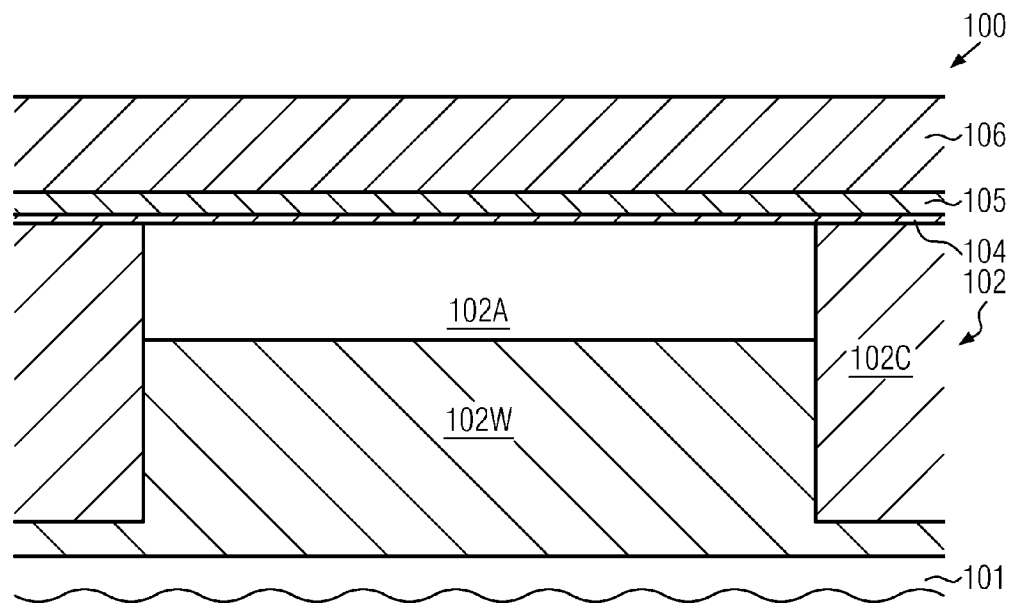

FIG. 5 schematically illustrates the device 100 with an appropriate etch mask 106 formed above the hard mask layer 105. For example, the mask 106 may be provided in the form of a resist material and the like.

Figures 6A, 6B:
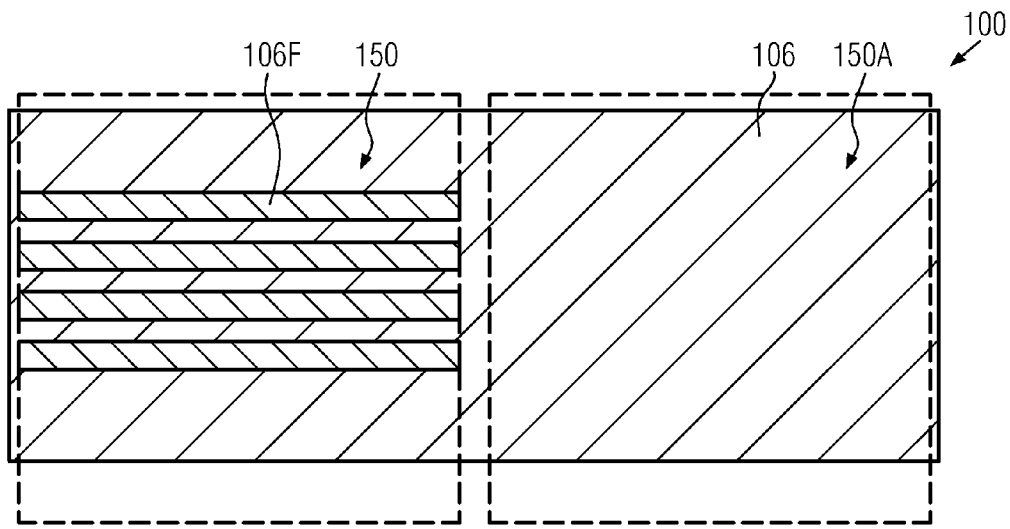

FIGS. 6*a* and 6*b* schematically illustrate a top view of the etch mask 106. As shown, in an area which may correspond to the FinFET 150, the photo mask 106 may comprise respective mask openings 106F, which may correspond to spaces between the corresponding semiconductor fins to be formed in a later manufacturing stage. On the other hand, in an area which may correspond to a planar transistor 150A, as shown in FIG. 6*b*, the etch mask 106 may continuously cover the underlying hard mask material in order to avoid the patterning thereof.

It should be appreciated that the etch mask 106 may be applied in a manufacturing stage in which superior surface conditions may be encountered in the device 100. That is, except for forming the isolation regions 102C, any topography inducing process steps may not have been performed, thereby providing superior conditions for any subsequent lithography process. The patterning ability of the lithography technique including any additional process steps for finally providing mask features 106F may comply with the requirements of the semiconductor fins and may have a width of approximately 20 nm in highly sophisticated applications. For example, advanced optical lithography techniques may be applied in combination with appropriate resist patterning techniques and the like, while in other cases extreme UV or electron beam lithography techniques may be applied. Also, in other cases, patterning strategies may be used which are also applied upon forming sophisticated shallow trench isolation (STI) structures. Moreover, as shown in FIGS. 6*a* and 6*b*, the mask layer 106 may also distinguish between planar transistors and FinFETs which may be accomplished by providing a non-patterned portion for planar transistors, as discussed above. Moreover, the hard mask material may be removed efficiently in a later manufacturing stage upon etching the actual semiconductor fins, thereby also efficiently removing the non-patterned mask 106 from above the semiconductor material corresponding to the planar transistor configuration.

Figure 7:
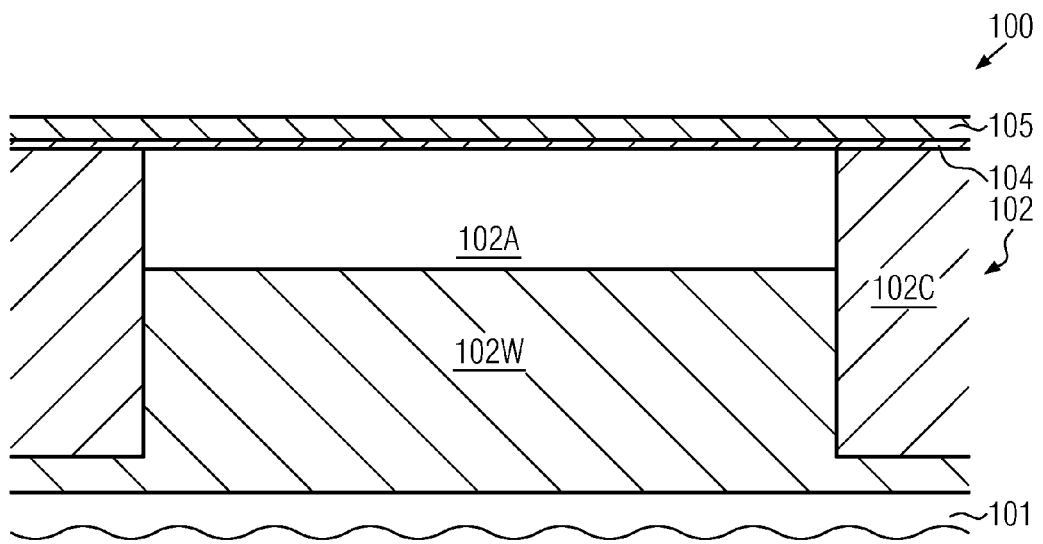

FIG. 7 schematically illustrates the device 100 in a further advanced manufacturing stage, i.e., after patterning the hard mask layer 105, i.e., after transferring the pattern of the mask layer 106 (FIGS. 6*a*, 6*b*) into the hard mask layer 105, while the layer 104 may be used as an efficient etch stop material. To this end, any well-established plasma-based etch recipes may be applied.

Figures 8A, 8B:
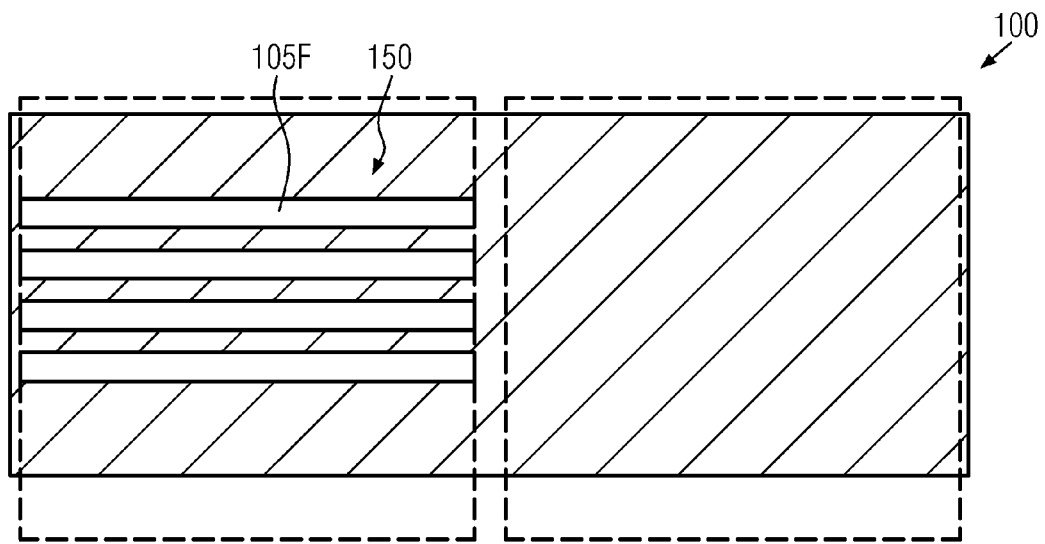

FIGS. 8*a* and 8*b* schematically illustrate the resulting patterned hard mask portions for an area corresponding to the FinFET transistor (FIG. 8*a*) and for an area corresponding to a planar transistor (FIG. 8*b*). As shown in FIG. 8*a*, the hard mask layer 105 comprises a plurality of mask features 105F, which may thus correspond to the lateral size or width and position of semiconductor fins to be formed in a later manufacturing stage. It should be appreciated that the actual length thereof may be adjusted upon forming the gate electrode structure, thereby obtaining the self-aligned behavior upon forming the semiconductor fins.

Figure 9:
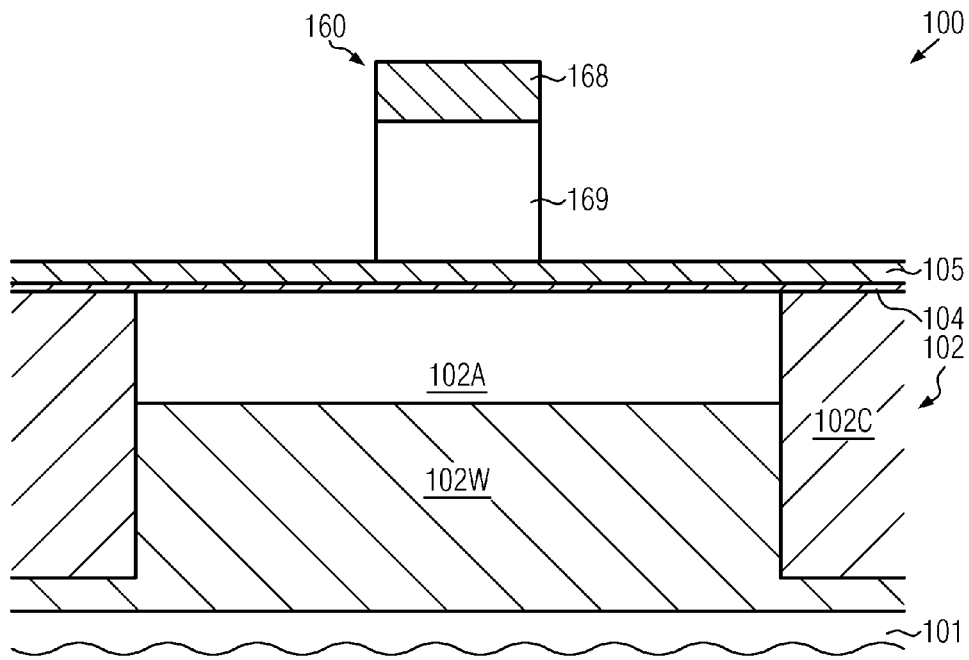

FIG. 9 schematically illustrates a cross-sectional view of the device 100 in a further advanced manufacturing stage. As shown, the gate electrode structure 160 may be formed on the hard mask layers 105, 104 and may represent a placeholder gate electrode structure in this manufacturing stage. As shown, a placeholder material 169, such as a polysilicon material, may be provided in combination with an additional material layer or layer system 168, such as a silicon nitride material, a silicon oxide material and the like. For example, using polysilicon or generally a semiconductor material, such as amorphous silicon, silicon/germanium and the like, as the placeholder material 169 may enable the application of well-established patterning strategies for forming complex gate electrode structures. To this end, the materials 169 and 168 may be deposited on the basis of any appropriate process strategy and subsequently any sophisticated lithography techniques may be applied so as to form the electrode structure 160 with the desired lateral dimensions. It should be appreciated that the cap material or material system 168 may be used as an efficient hard mask material according to some established patterning strategies.

Figure 10:
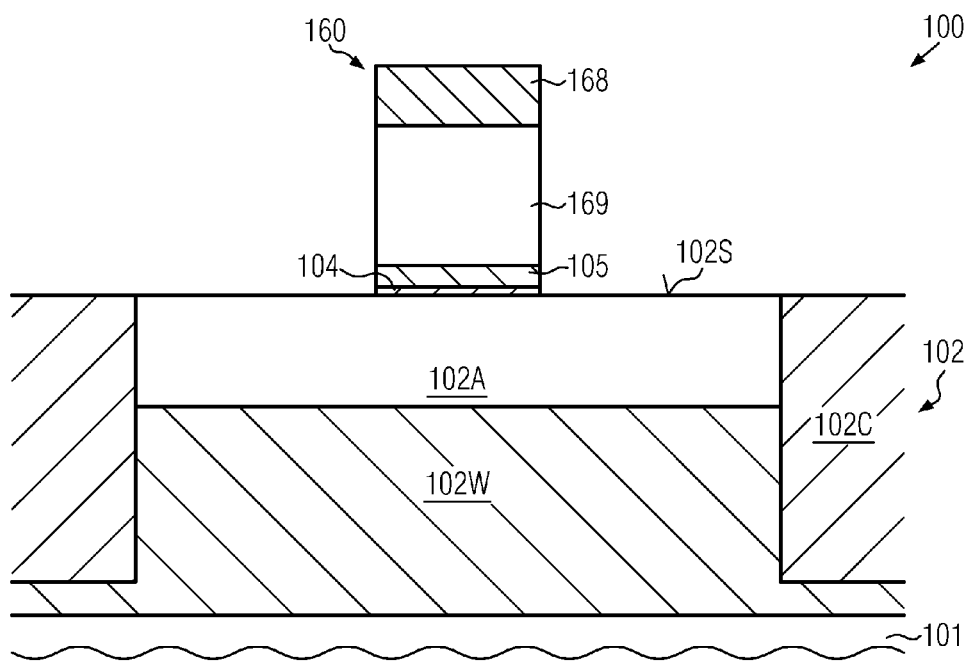

FIG. 10 schematically illustrates the device 100 after the removal of the exposed portions of the hard mask layer stack 105, 104, thereby exposing a surface 102S of the active region 102A. To this end, well-established wet chemical etch chemistries, plasma assisted etch chemistries, or a combination thereof, may be applied.

Figure 11:
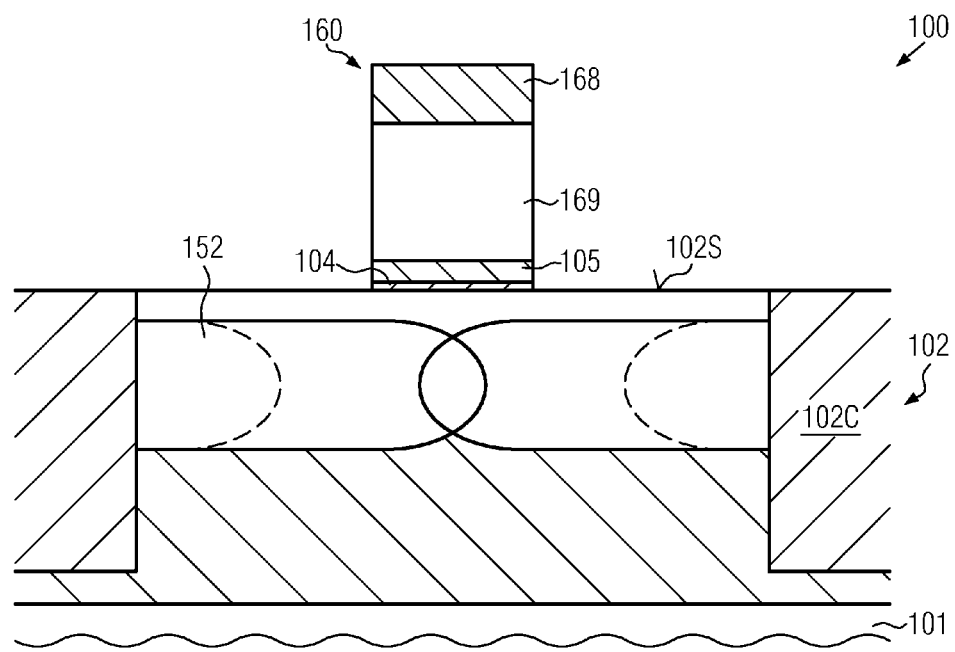

FIG. 11 schematically illustrates the device 100 in a manufacturing stage in which, in some illustrative embodiments, additional well dopant species may be incorporated in the form of halo regions 152, which may result in superior channel controllability and the like, depending on the overall transistor characteristics. To this end, any well-established implantation techniques may be applied, wherein, however, in some illustrative embodiments, any additional implantation processes for implementing drain and source dopant species, for instance for forming drain and source extension regions, may not be required and may be omitted.

Figure 12:
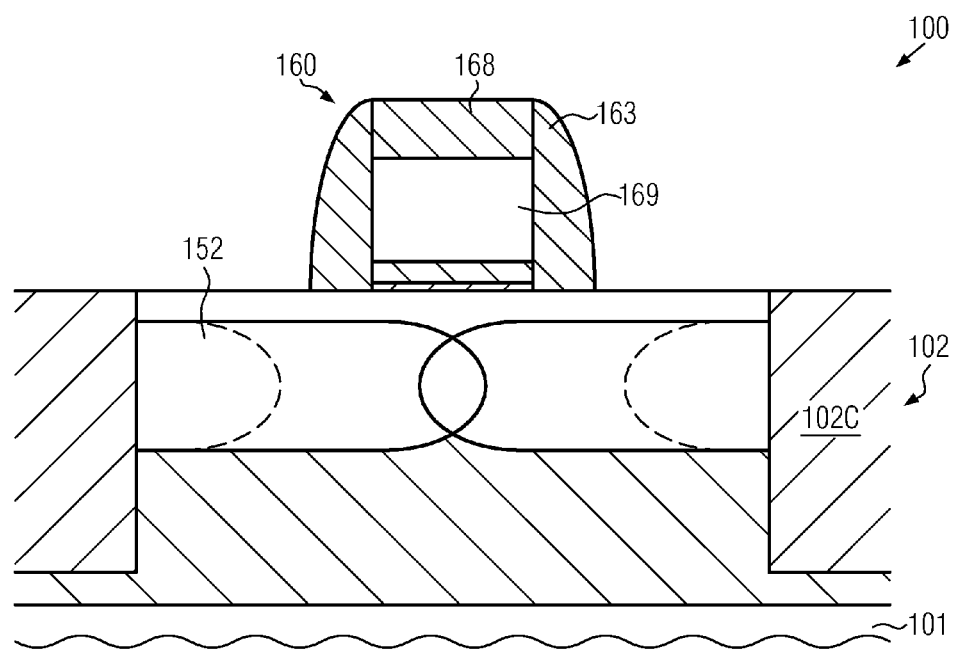

FIG. 12 schematically illustrates the device 100 in a further advanced manufacturing stage in which a spacer structure 163 may be formed so as to encapsulate the placeholder material 169 when this material is comprised of a semiconductor material, which may result in semiconductor growth during a subsequent selective epitaxial growth process. Consequently, if provided as a polysilicon material and the like, the material 169 may be appropriately encapsulated by the dielectric cap layer or layer system 168 and the spacer structure 163. The spacer structure 163 may be formed on the basis of well-established deposition and etch techniques, wherein a width of the spacer 163 may be adjusted so as to correspond to the overall device characteristics, i.e., with respect to the desired lateral offset of drain and source regions still to be formed.

Figure 13:
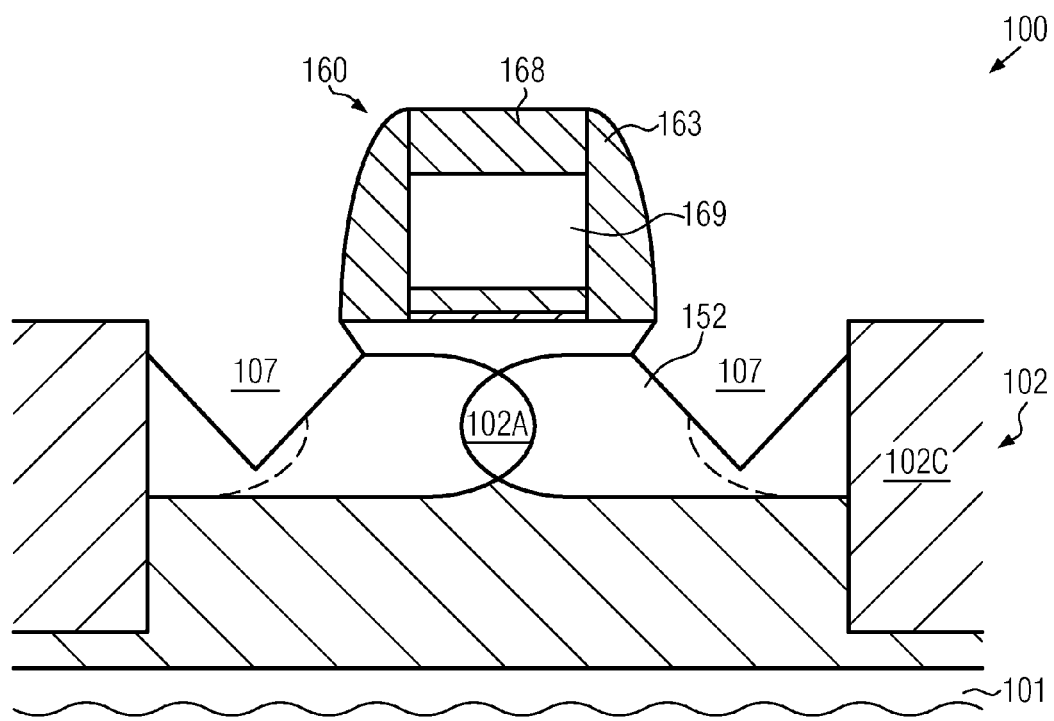

FIG. 13 schematically illustrates the device 100 in a manufacturing stage in which cavities 107 may be formed in the active region 102A with an appropriate cross-sectional shape and size so as to comply with the overall device requirements. In some illustrative embodiments, the cavities 107 may be formed on the basis of plasma-based anisotropic etch strategies, thereby forming a substantially box-shaped configuration, as for instance shown with reference to FIGS. 1a-1e. In other cases, in addition to or alternatively to an anisotropic etch process, a wet chemical etch process may be applied in which a certain degree of under-etching, at least of the spacer structure 163, may be established. For example, crystallographically anisotropic etch chemistries may be used, such as TMAH (tetra methyl ammonium hydroxide) in which certain crystal planes such as (111) planes may act as efficient etch stop layers. In this case, substantially self-limiting etch behavior may be accomplished wherein, if desired, the start conditions of the crystallographically anisotropic etch process may be adjusted by forming an additional anisotropic plasma assisted etch step so as to define an initial depth of the cavities 107. In other illustrative embodiments, a plasma assisted etch process may be avoided and a wet chemical etch process may be exclusively used for forming the cavities 107. It should be appreciated that also isotropic etch processes may be applied in combination with plasma assisted etch processes in which a substantially similar etch rate in the lateral direction and the vertical direction may be achieved, wherein a desired degree of under-etching may be adjusted on the basis of the overall process time for given etch parameters. Consequently, the cavities 107 may be formed in a highly controllable manner, thereby providing the possibility of precisely determining the overall transistor characteristics and in particular determining the depth and the finally obtained channel length of FinFETs and planar transistors.

Figure 14:
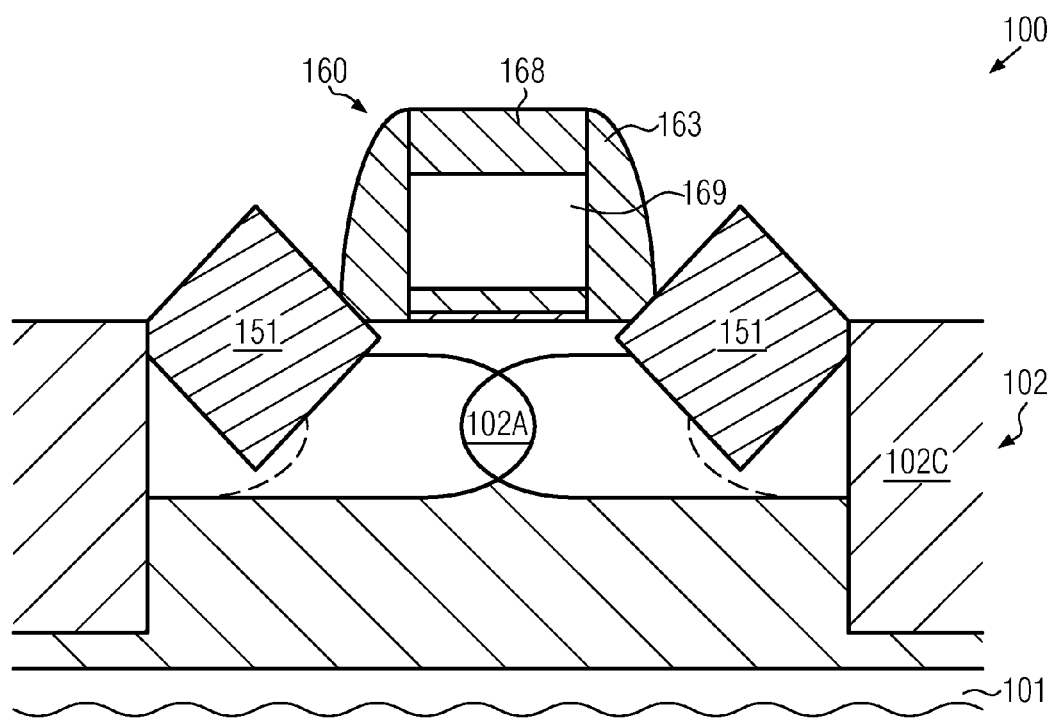

FIG. 14 schematically illustrates the device 100 in a further advanced manufacturing stage in which an in situ doped semiconductor material may be incorporated into the cavities 107 (FIG. 13), thereby providing the drain and source regions 151 in a highly controllable manner. To this end, selective epitaxial growth techniques may be applied in order to form the regions 151 with an appropriate material composition, such as in the form of a silicon material, a silicon/carbon material, a silicon/germanium material, a silicon/phosphorous material and the like, thereby also providing, if required, an efficient strain-inducing mechanism since the material 151 may be incorporated in a highly strained state. At the same time, an appropriate dopant, such as boron for P-channel transistors or phosphorous for N-channel transistors, may be incorporated during the deposition, thereby also obtaining a very precisely defined initial profile of the drain and source regions 151, which is thus substantially determined by the shape of the cavities 107 (FIG. 13).

With reference to FIGS. 15-18, the process sequence may be described in which appropriate drain and source regions may be formed for P-channel transistors and N-channel transistors, respectively.

Figure 15:
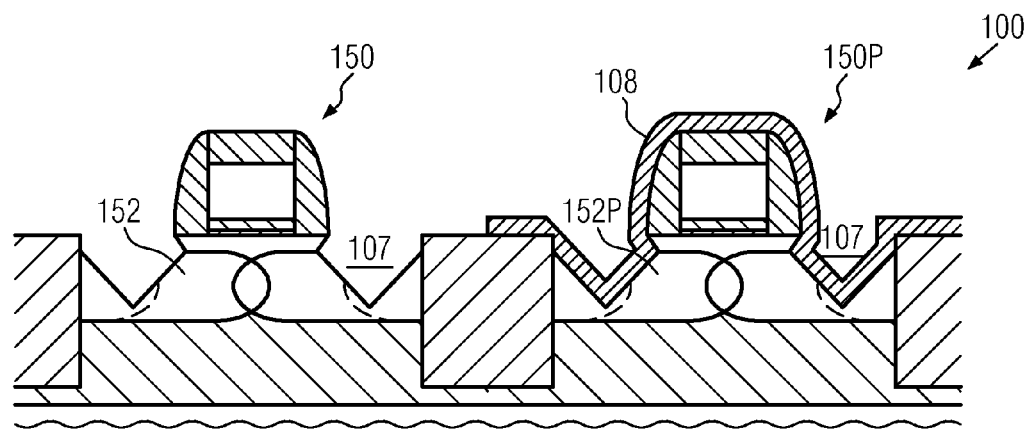

FIG. 15 schematically illustrates the device 100 in which the transistor 150 and a further transistor 150P may have formed in their respective active regions the cavities 107, for instance in the form of sigma-shaped cavities, as is also discussed above. For example, it may be assumed that the transistor 150 may represent an N-channel transistor, while the transistor 150P may represent a P-channel transistor. As shown, a hard mask layer 108 may be formed selectively above the transistor 150P in order to enable a selective deposition of a desired in situ doped semiconductor material, which may also have specific strain conditions, if desired, in the transistor 150. The hard mask 108 may be formed, for instance, by depositing a silicon dioxide material and the like, and selectively removing the layer 108 from above the transistor 150 on the basis of well-established lithography and etch techniques.

Figure 16:
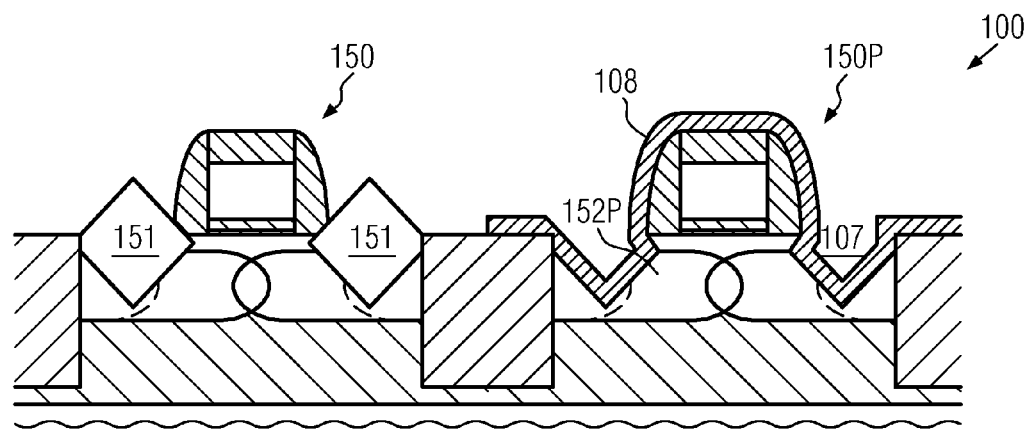

FIG. 16 schematically illustrates the device 100 after the selective epitaxial growth of the drain and source regions 151 with an appropriate strain condition and with an appropriate in situ doping.

Figure 17:
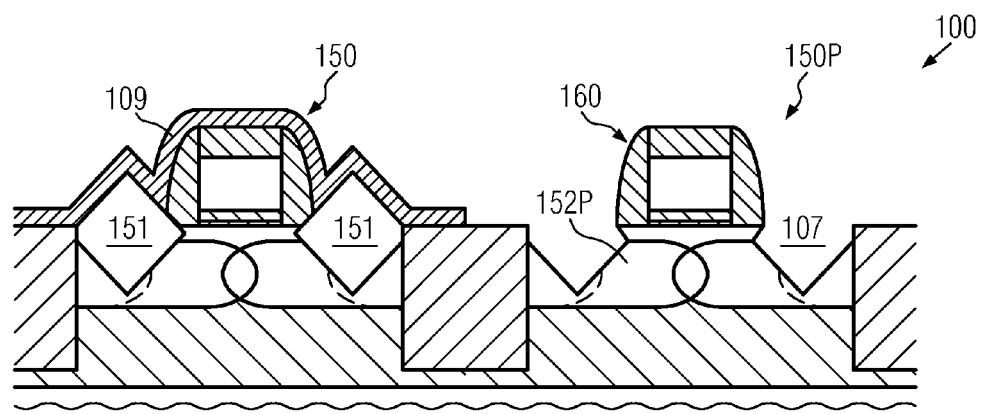

FIG. 17 schematically illustrates the device 100 in a further advanced manufacturing stage according to illustrative embodiments. As shown, the transistor 150P may be exposed so as to allow a further selective epitaxial growth process for filling an appropriate semiconductor material into the cavities 107 of the transistor 150P. In the embodiment shown, a hard mask 109 may be formed above the transistor 150 while in other cases a corresponding hard mask may be omitted, for instance when material 151 of the transistor 150 may have a specific surface configuration, for instance a sigma-shaped configuration, wherein any exposed surface areas may substantially avoid the further deposition of a selectively grown semiconductor material. It should be appreciated that certain selective epitaxial growth recipes are sensitive to the crystal orientation of the template material and certain selectivity may be accomplished by adjusting process parameters so as to correspond to a desired lattice structure. In this case, the cavities 107 may be shaped so as to provide at least one surface on which the corresponding epitaxial growth may be initiated, while a corresponding growth at exposed surface areas of the regions 151 in the transistor 150 may be suppressed.

Figure 18:
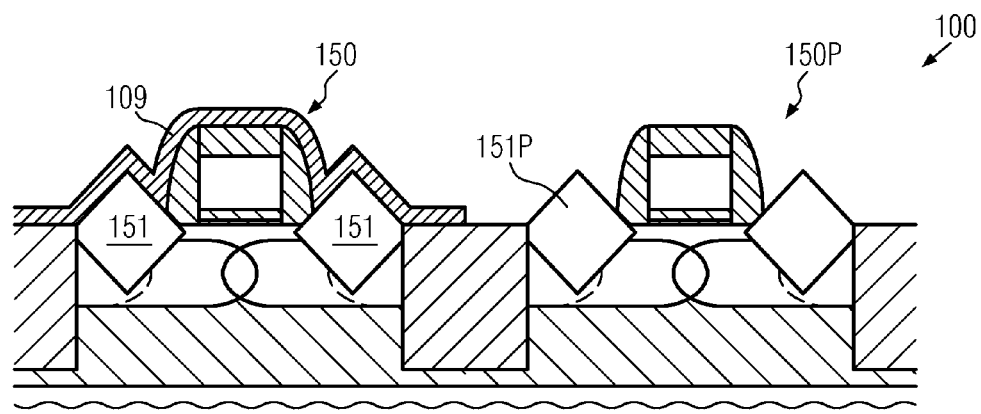

FIG. 18 schematically illustrates the device 100 in a further advanced manufacturing stage in which drain and source regions 151P are formed in the transistor 150P so as to have the desired in situ doping and, if desired, an appropriate internal strain state. Thereafter, the hard mask 109, if provided, may be removed, for instance by well-established wet chemical etch recipes selectively with respect to any underlying materials.

Figure 19:
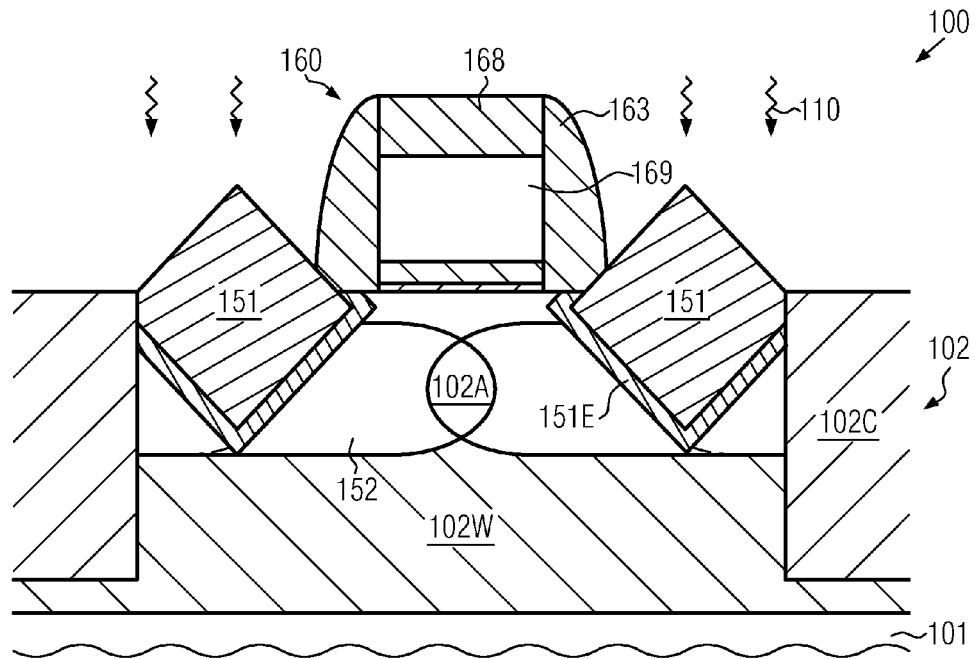

FIG. 19 schematically illustrates the device 100 in a further advanced manufacturing stage. As shown, the device 100 is subjected to an anneal process 110 in which the previously incorporated dopant species for the well concentration 102W and also for the halo regions 152 may be activated, while at the same time a certain degree of diffusion of the dopant species in the drain and source regions 151 may be initiated, thereby forming the extension regions 151E. To this end, the anneal process 110 may be performed on the basis of appropriately selected process parameters in order to establish the drain and source extension regions 151E with a desired lateral size in order to appropriately connect to the channel region and thus adjust the overall transistor characteristics. To this end, well-controllable anneal techniques may be applied, such as laser-based anneal techniques, flashlight-based anneal techniques, rapid thermal anneal (RTA) processes and the like. Furthermore, when providing a silicon/germanium material in the drain and source regions 151 of at least some transistors, the out-diffusion of the dopants forming the drain and source extension regions 151E may result in formation of PN junctions with the well dopant species outside of the silicon/germanium material, thereby ensuring reduced leakage behavior of the resulting silicon-based PN junctions, which may be advantageous for bulk devices, which may not require the discharge of any accumulating charge carriers, as is the case in SOI devices. Moreover, in other illustrative embodiments, drain and source dopant species may be incorporated by ion implantation, for instance in other planar transistors and the like, and a corresponding dopant activation and the re-crystallization of implantation-induced damage may also be accomplished during the one or more anneal processes 110. Thereafter, the further processing may be continued by depositing an appropriate interlayer dielectric material, such as the one or more materials as previously described with reference to FIGS. 1a-1f, which may be accomplished by any well-established deposition techniques. For example, a substantially conformal silicon nitride material may be provided in combination with a silicon dioxide material, wherein, if required, at least a portion of the interlayer dielectric material may be formed as a highly stressed dielectric material so as to further enhance overall transistor performance. Thereafter, the corresponding materials may be planarized and subsequently an appropriate contact regime may be applied in order to form contact elements so as to connect to the drain and source regions, if required. To this end, any well-established process strategy may be applied, for instance for forming contact elements with reduced lateral dimensions, contact bars, self-aligned contact elements and the like.

Figure 20:
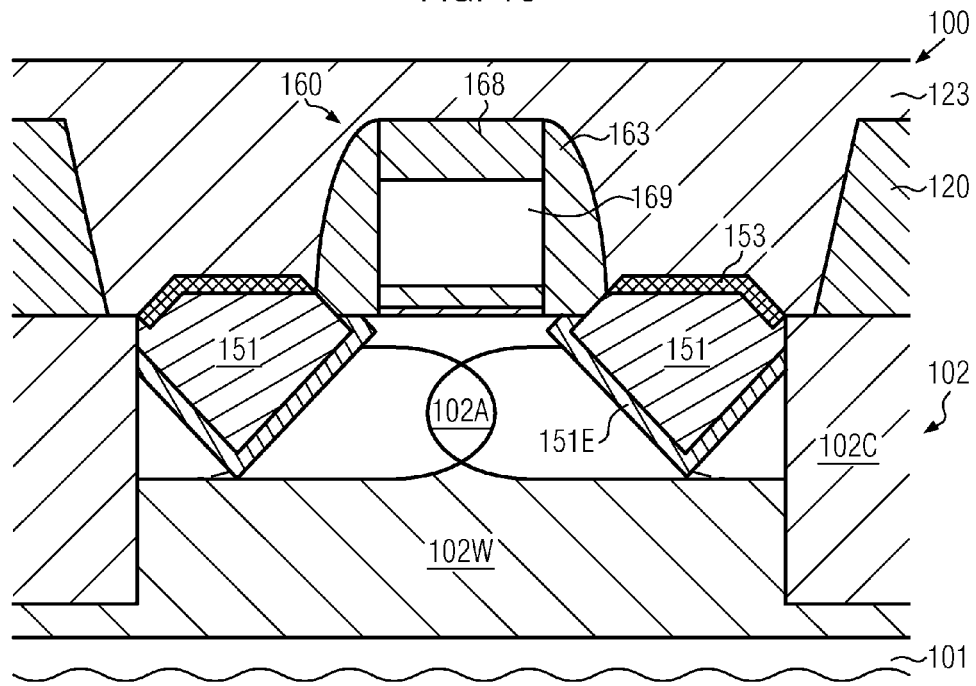

FIG. 20 schematically illustrates the semiconductor device 100 in a further advanced manufacturing stage. As shown, the interlayer dielectric material 120 may be patterned so as to expose the drain and source regions 151, which may be accomplished by appropriate lithography and etch techniques, depending on the overall process strategy. Moreover, in some illustrative embodiments, prior to or after forming the interlayer dielectric material 120, a metal silicide material 153 may be provided, for instance in the form of a nickel silicide and the like. To this end, well-established silicidation techniques may be applied, while in other cases, upon forming a contact opening in the interlayer dielectric material 120, the silicide 153 may be formed, for instance prior to or during the deposition of a further contact material 123, such as a tungsten material and the like. In the embodiment shown, the material 123 may be provided on the basis of self-aligned contact trenches, which are subsequently filled by any appropriate contact material, followed by a further material removal process so as to remove any excess material of the metal 123. To this end, well-established CMP techniques may be applied.

Figure 21:
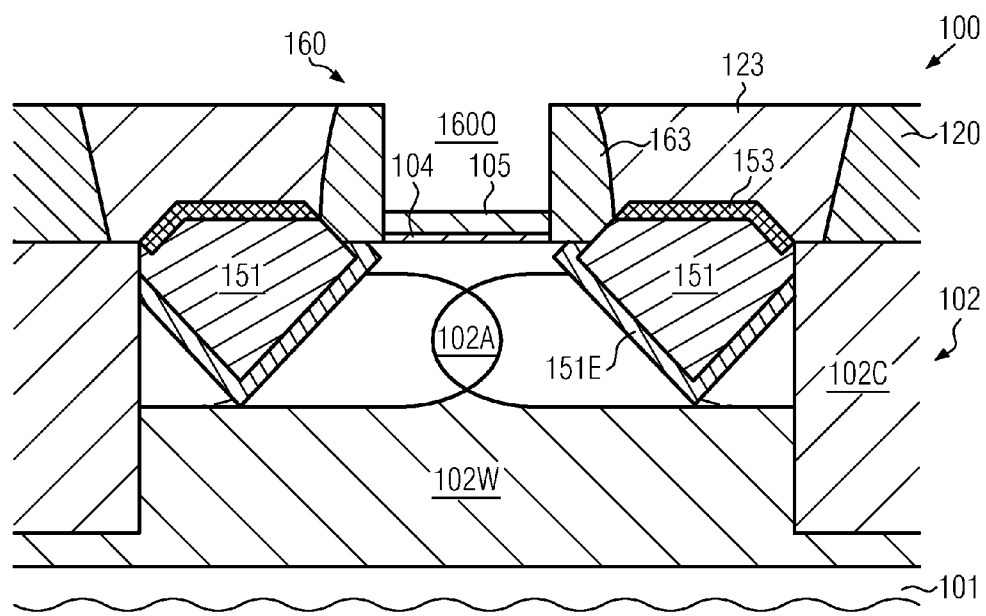

FIG. 21 schematically illustrates a cross-sectional view of the device 100 in a further advanced manufacturing stage. As shown, the contact elements 123 are provided as electrically isolated elements by removing any excess material, as discussed above, thereby also exposing the gate electrode structure 160. Thereafter, the placeholder material, for instance provided in the form of a polysilicon material, may be removed by any appropriate selective etch chemistry, for instance by using TMAH, wherein the spacer elements 163, the contact elements 123, the interlayer dielectric material 120 and the buried etch mask 105 may act as efficient etch stop material. Consequently, an appropriate opening or trench 160o may be provided in the gate electrode structure 160, which thus exposes the buried etch mask 105.

Figures 22A, 22B:
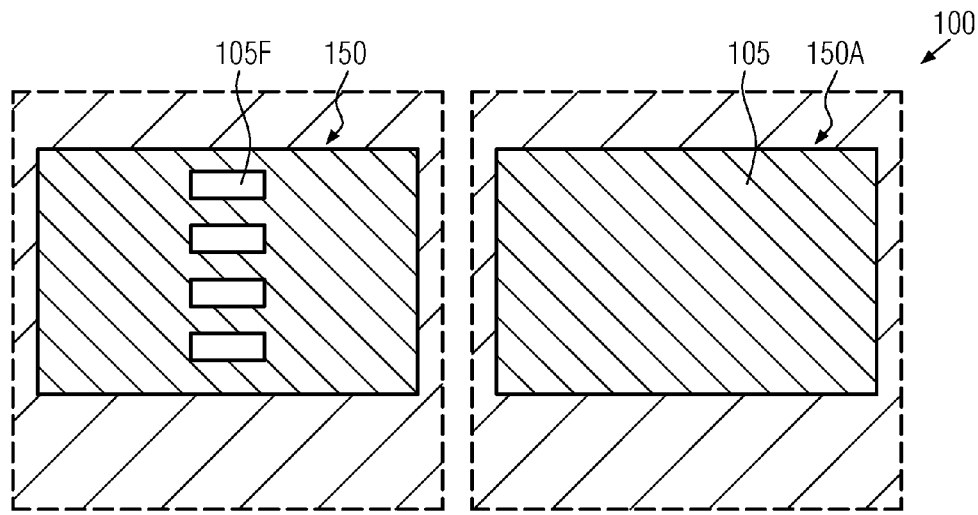

FIGS. 22A, 22B schematically illustrate a top view of the transistor 150 and of the planar transistor 150A, respectively, wherein, for convenience, substantially a corresponding buried etch mask 105F for the transistor 150 and 105 for the transistor 150A is illustrated. As shown, the etch mask 105F comprises the mask features 105F, which may thus substantially correspond to the semiconductor fins still to be formed in the underlying semiconductor material. On the other hand, the mask 105 may continuously cover the semiconductor material in the planar transistor 150A. Thereafter, an appropriate etch strategy may be applied, for instance based on selective reactive ion etching techniques, in which the mask 105, 105F may efficiently avoid undue semiconductor material erosion, while nevertheless etching into the underlying semiconductor material for the transistor 150.

Figure 23:
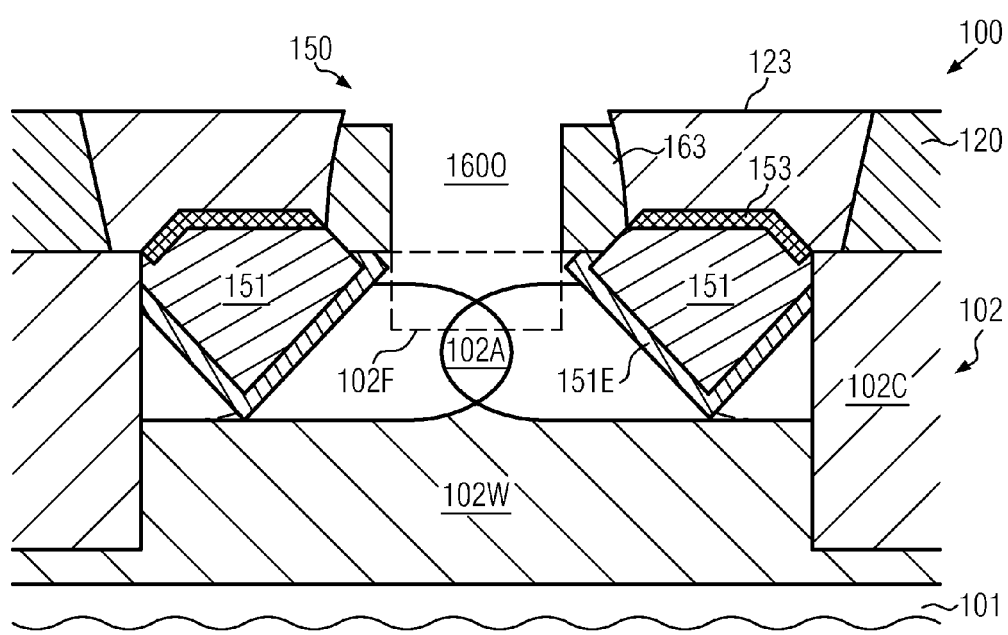

FIG. 23 schematically illustrates the semiconductor device 100 in an intermediate stage for etching into the semiconductor material in the transistor 150, thereby increasingly forming the corresponding cavities 102F of the underlying semiconductor material.

FIGS. 24A, 24B schematically illustrate the device 100 in a further advanced stage of the etch process, wherein the cavities 102F (FIG. 23) are increased in depth so as to extend into the well region in order to obtain the required height of the resulting cavities, which are still covered by the mask features 105F. On the other hand, the mask 105 still reliably covers the underlying channel region of the transistor 150A.

FIGS. 25A, 25B schematically illustrate corresponding cross-sectional views corresponding to FIGS. 24A, 24B, respectively. As shown, the cavities 102F extend into the well region 102W with a desired depth, thereby forming the semiconductor fins 111. As shown, the fins are still covered by the mask features 105F. On the other hand, the active region 102A of the transistor 150A is still reliably covered by the mask 105 within the corresponding gate opening 160o.

FIGS. 26a, 26b schematically illustrate the semiconductor device 100 in a further advanced manufacturing stage in which an etch process and corresponding cleaning recipes may be applied so as to remove the silicon nitride material of the mask layer 105 (FIGS. 25a, 25b) and also remove any underlying etch stop material, such as the silicon dioxide material and the like, which may have been provided in combination with the silicon nitride hard mask material. To this end, well-established wet chemical etch chemistries may be applied, plasma-assisted etch recipes may be used for removing the nitride material selectively with respect to silicon dioxide and tungsten, for which well-established recipes are established. After any cleaning process, for instance for removing any oxide residues, the devices 150, 150A may be prepared for receiving appropriate gate materials.

FIGS. 27a, 27b illustrate cross-sectional views of the devices 150, 150A in this manufacturing stage. As illustrated the semiconductor fins 111 are formed with the desired fin height or depth 111H on the basis of the previously etched cavities 102F. On the other hand, the continuous semiconductor region 102A is provided in the planar transistor 150A. Next, appropriate gate materials may be deposited or formed by oxidation, depending on the overall process strategy. For example, if required, a thin oxide material may be formed, for instance by chemical oxidation, in order to avoid high temperature processes, while in other cases appropriate dielectric materials may be deposited on the basis of well-established deposition techniques, such as atomic layer deposition (ALD), CVD and the like. The deposition of a dielectric material may also include the deposition of a high-k dielectric material, as required by the overall transistor characteristics. Thereafter, one or more electrode materials may be deposited, for instance in the form of a work function metal layer, possibly in combination with additional conductive barrier material, when a corresponding patterning of the work function metal layers is to be applied in order to position different work function metals above P-channel transistors and N-channel transistors, respectively. Thereafter, highly conductive electrode metals, such as aluminum and the like, may be formed, wherein also any appropriate deposition recipes may be applied.

Figure 28:
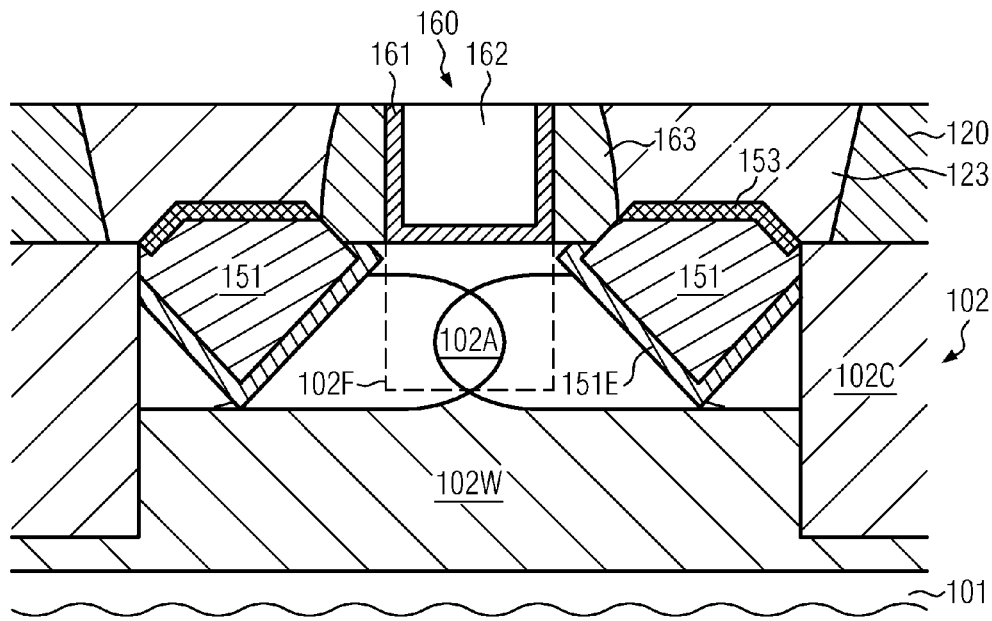

FIG. 28 schematically illustrates the semiconductor device 100 in a further advanced manufacturing stage. As shown, the gate electrode structure 160 may comprise an appropriate dielectric material 161, such as a conventional dielectric material in combination with a high-k dielectric material, a high-k dielectric material without conventional dielectrics and the like, while an electrode material 162, for instance comprising two or more different metal-containing materials in order to adjust appropriate work function values and generally adjust the overall electronic characteristics of the gate electrode structure 160. Moreover, after the deposition of the materials 161 and 162, any excess material may be removed, for instance by CMP and the like, thereby forming the gate electrode structure 160 as an electrically isolated component.

Figure 29:
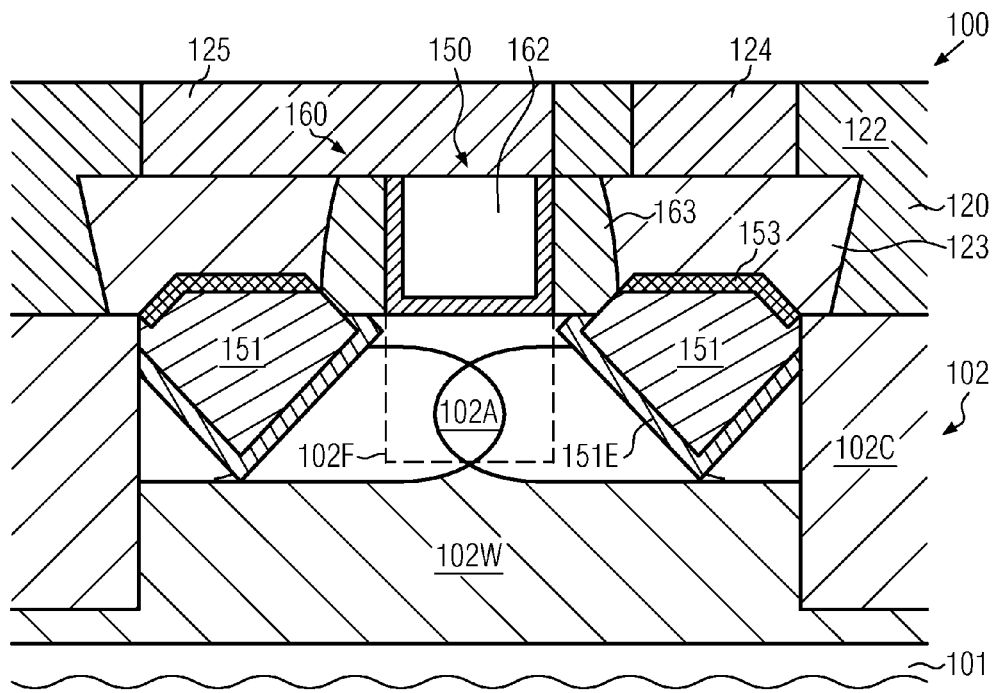

FIG. 29 schematically illustrates the semiconductor device 100 in a further advanced manufacturing stage in which the contact level may be completed, i.e., a further portion of the interlayer dielectric material 120 may be provided, for instance in the form of a silicon dioxide material and the like, followed by a patterning process in order to connect to the previously formed contact elements 123 and to the gate electrode structure 160 in accordance with any appropriate contact regime. For example, a contact element 125 may be provided so as to directly connect the gate electrode structure 160 with one of the drain and source contacts of the transistor 150, while a separate contact element 124 may connect to the other one of the drain and source regions via the contact element 123. It should be appreciated, however, that any other appropriate contact scheme may be applied in accordance with the overall requirements of the device 150. The contact elements 124, 125 may be formed on the basis of any appropriate material, such as copper, tungsten, aluminum, silver and the like, by applying appropriate patterning strategies and deposition and planarization techniques. Thereafter, an appropriate metal system may be formed above the interlayer dielectric material 120 so as to appropriately connect to the contact elements 124 and/or 125.

As a result, the present disclosure provides manufacturing techniques and semiconductor devices in which FinFET devices in bulk architecture may be implemented in a highly efficient manner on the basis of well-established replacement gate approaches wherein a buried etch mask may be used for forming the semiconductor fins in a very late manufacturing stage, i.e., upon forming the replacement gate electrode structure. Thus, the advantages of FinFETs, i.e., increased performance at higher device density, superior short channel control and reduced transistor variability, which is typically caused by random dopant fluctuations, may be achieved without unduly contributing to increased process complexity. For example, a high degree of compatibility with currently applied replacement gate approaches may be achieved based on the concept of providing a buried etch mask and appropriately modifying the replacement gate sequence in order to form the semiconductor fins and appropriately removing the buried etch mask. Moreover, planar field effect transistors may be implemented, for example on the basis of cavities formed in the corresponding drain and source regions or on the basis of implantation techniques without forming cavities in the drain and source areas, depending on the overall process strategy.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a hard mask layer above a semiconductor region of a semiconductor device, said hard mask layer comprising a plurality of mask features defining a lateral size and position of a plurality of fins to be formed in said semiconductor region;
   forming a placeholder gate electrode structure above said hard mask layer, wherein forming said placeholder gate electrode structure comprises forming a spacer structure adjacent to sidewalls of a placeholder material;
   forming drain and source regions in said semiconductor region in the presence of said placeholder gate electrode structure;
   after forming said drain and source regions, forming said fins in said semiconductor region by removing at least said placeholder material from said placeholder gate electrode structure and forming cavities in said semiconductor region by using said hard mask layer as an etch mask; and
   forming a gate dielectric material and an electrode material in said cavities and above said fins.

2. The method of claim 1, wherein forming said cavities comprises forming said cavities so as to extend to a depth that is below a depth of said drain and source regions.

3. The method of claim 1, wherein forming said drain and source regions comprises forming drain and source cavities in said semiconductor region and refilling said drain and source cavities with a doped semiconductor material.

4. The method of claim 3, wherein forming said drain and source regions further comprises performing an anneal process so as to initiate diffusion of dopants of said doped semiconductor material.

5. The method of claim 4, further comprising forming a halo region in said semiconductor region prior to performing said anneal process.

6. The method of claim 3, wherein said drain and source cavities are formed by using a crystallographically anisotropic etch process.

7. The method of claim 3, wherein forming said drain and source cavities comprises performing a plasma assisted etch process.

8. The method of claim 1, wherein forming said fins comprises performing a first etch process using a wet chemical etch technique so as to remove at least a portion of said placeholder material and performing a second etch process using a plasma based etch technique so as to form said cavities.

9. The method of claim 8, wherein forming said fins further comprises performing a final etch process so as to remove residuals of an exposed portion of said hard mask layer.

10. The method of claim 3, wherein forming said drain and source regions comprises filling said drain and source cavities at least partially with a strain-inducing semiconductor material.

11. The method of claim 1, wherein forming said drain and source regions comprises using said spacer structure to adjust a lateral offset of said drain and source regions.

12. The method of claim 1, wherein forming said hard mask layer comprises forming said hard mask layer so as to cover a second semiconductor region and wherein the method further comprises forming a second placeholder gate electrode structure above said second semiconductor region and removing a placeholder material of said second placeholder gate electrode structure without forming cavities in said second semiconductor region.

13. The method of claim 12, further comprising forming drain and source regions in said second semiconductor region by ion implantation prior to forming said drain and source regions in said semiconductor region.

14. A method of forming a semiconductor device, the method comprising:
forming a gate opening in a placeholder gate electrode structure that is formed above a semiconductor region, said gate opening being defined at least by a spacer structure formed adjacent to sidewalls of a placeholder material comprising said placeholder gate electrode structure;
forming a plurality of fins in said semiconductor region through said gate opening by forming cavities in said semiconductor region; and
forming a gate dielectric material and an electrode material in said cavities and said gate opening.

15. The method of claim 14, wherein forming said plurality of fins in said semiconductor region comprises forming a hard mask layer above said semiconductor region prior to forming said placeholder gate electrode structure above said semiconductor region.

16. The method of claim 14, further comprising forming drain and source regions in said semiconductor region prior to forming said gate opening.

17. The method of claim 16, wherein forming said drain and source regions comprises forming drain and source cavities in said semiconductor region and filling said drain and source cavities with an in situ doped semiconductor material.

18. The method of claim 17, wherein forming said drain and source regions further comprises initiating a diffusion of a dopant species of said in situ doped semiconductor material so as to electrically connect said drain and source regions to said fins.

19. The method of claim 16, wherein forming said drain and source regions comprises using said spacer structure to adjust a lateral offset of said drain and source regions.

20. The method of claim 1, wherein forming said hard mask layer comprises forming an etch stop layer above said semiconductor region and forming said hard mask layer above said etch stop layer.

\* \* \* \* \*